United States Patent
Sakurai et al.

(10) Patent No.: US 7,859,210 B2
(45) Date of Patent: Dec. 28, 2010

(54) SEMICONDUCTOR DEVICE FOR DRIVING MOTOR, THREE-PHASE MOTOR AND MOTOR DRIVING APPARATUS WITH THE SEMICONDUCTOR DEVICE AND FAN MOTOR

(75) Inventors: Kenji Sakurai, Hitachi (JP); Hiroyuki Hasegawa, Hitachi (JP); Tomoyuki Utsumi, Hitachi (JP); Shoichi Ohozeki, Hitachi (JP); Daisuke Maeda, Hitachi (JP); Mitsuhiro Mishima, Tokai (JP)

(73) Assignees: Hitachi, Ltd., Tokyo (JP); Hitachi Information & Control Solutions, Ltd., Ibaraki (JP)

( * ) Notice: Subject to any disclaimer, the term of this patent is extended or adjusted under 35 U.S.C. 154(b) by 390 days.

(21) Appl. No.: 12/024,145

(22) Filed: Feb. 1, 2008

(65) Prior Publication Data
US 2008/0224643 A1 Sep. 18, 2008

(30) Foreign Application Priority Data
Mar. 16, 2007 (JP) ............................. 2007-067800

(51) Int. Cl.
*H02P 27/04* (2006.01)
(52) U.S. Cl. .................. 318/400.26; 318/471; 318/484; 318/494; 318/811; 318/801; 323/300; 323/237; 323/320; 388/800; 363/124; 363/127; 363/131; 363/80; 363/98
(58) Field of Classification Search ............ 318/400.01, 318/432, 434, 599, 400.26, 811, 801, 471, 318/484, 494; 323/300, 237, 320; 388/800; 363/124, 127, 131, 80, 97, 98
See application file for complete search history.

(56) References Cited

U.S. PATENT DOCUMENTS

| | | | | |
|---|---|---|---|---|
| 5,908,286 A | * | 6/1999 | Clemmons | 417/44.2 |
| 5,969,496 A | * | 10/1999 | Yamada et al. | 318/715 |
| 6,324,085 B2 | * | 11/2001 | Kimura et al. | 363/132 |
| 7,180,217 B2 | * | 2/2007 | Nakayama et al. | 310/179 |
| 7,183,835 B2 | * | 2/2007 | Sakata et al. | 327/434 |
| 7,628,028 B2 | * | 12/2009 | Tolbert et al. | 62/228.4 |
| 2003/0053323 A1 | * | 3/2003 | Kimura et al. | 363/98 |
| 2004/0008530 A1 | * | 1/2004 | Kitahata et al. | 363/131 |
| 2007/0126384 A1 | * | 6/2007 | Takata et al. | 318/432 |
| 2007/0145941 A1 | * | 6/2007 | Asada et al. | 318/811 |

(Continued)

FOREIGN PATENT DOCUMENTS

JP 11-004150 1/1999

(Continued)

*Primary Examiner*—Rita Leykin
(74) *Attorney, Agent, or Firm*—Antonelli, Terry, Stout & Kraus, LLP.

(57) ABSTRACT

In order to prevent a short circuit of top and bottom arms of a motor driving IC when noise is added to six control signals for controlling six switching elements, there is provided a semiconductor device for driving a motor, being sealed with resin as one package and comprising: six switching elements for driving a three-phase motor; three output terminals for outputting voltages to the three-phase motor; at least one driving circuit for driving the six switching elements; three control signal input terminals; and a function) of generating six control signals for control of the six switching elements based on three control signals inputted through the three control signal input terminals.

17 Claims, 16 Drawing Sheets

U.S. PATENT DOCUMENTS

2007/0268052 A1 * 11/2007 Yin et al. .................. 327/175

FOREIGN PATENT DOCUMENTS

| JP | 2001-327171 | 11/2001 |
| JP | 2005-110366 | 4/2005 |
| JP | 2006-060985 | 3/2006 |
| JP | 2006-216989 | 8/2006 |

* cited by examiner

Td: DEAD TIME
Vth: THRESHOLD VOLTAGE OF NOT CIRCUITS NC2 AND NC4 IN FIG. 2

Td: DEAD TIME
Vth6: THRESHOLD VOLTAGE OF NOT CIRCUIT NC6 IN FIG. 4
Vth7: THRESHOLD VOLTAGE OF NOT CIRCUIT NC7 IN FIG. 4

Td: DEAD TIME AT HIGH TEMPERATURE
Vth6: THRESHOLD VOLTAGE OF NOT CIRCUIT NC6 IN FIG. 4
Vth7: THRESHOLD VOLTAGE OF NOT CIRCUIT NC7 IN FIG. 4

SEMICONDUCTOR DEVICE FOR DRIVING MOTOR, THREE-PHASE MOTOR AND MOTOR DRIVING APPARATUS WITH THE SEMICONDUCTOR DEVICE AND FAN MOTOR

BACKGROUND OF THE INVENTION

The present invention relates to a semiconductor device for driving a motor, and a three-phase motor, a motor driving apparatus and a fan motor which are equipped with the semiconductor device.

Three-phase permanent-magnet motors controlled by an inverter are widely used in recent years as motors for household electric appliances and for industrial use. Since noise reduction is required of the motors, the 180-degree sine wave drive is used in many cases as the driving method for the inverter.

An example of the 180-degree sine wave drive as a conventional technology will be explained below referring to FIG. 16.

As shown in FIG. 16, a motor driving semiconductor device 10B with six input terminals (hereinafter referred to as a "six-input motor driving IC 10B") is equipped with a motor driving semiconductor chip 10B' with six input terminals. In FIG. 16, the reference characters T1-T6 denote six switching elements (e.g. IGBTs (Insulated Gate Bipolar Transistors)) for driving a three-phase motor, and D1-D6 denote flywheel diodes which are connected in antiparallel with the IGBTs, respectively. The reference characters P9, P10 and P11 denote a U-phase output terminal, a V-phase output terminal and a W-phase output terminal. The output terminals are connected to coils 8 of the motor.

The reference character VUT' represents a U-phase top arm control signal, which is inputted through a U-phase top arm control signal input terminal P1 and transferred to an all-off circuit LG1, to a top arm driving circuit KT, and to the U-phase top arm IGBT T1. The reference character VVT' represents a V-phase top arm control signal, which is inputted through a V-phase top arm control signal input terminal P2 and transferred to the all-off circuit LG1, to the top arm driving circuit KT, and to the V-phase top arm IGBT T2. The reference character VWT' represents a W-phase top arm control signal, which is inputted through a W-phase top arm control signal input terminal P3 and transferred to the all-off circuit LG1, to the top arm driving circuit KT, and to the W-phase top arm IGBT T3. The reference character VUB' represents a U-phase bottom arm control signal, which is inputted through a U-phase bottom arm control signal input terminal P4 and transferred to the all-off circuit LG1, to a bottom arm driving circuit KB, and to the U-phase bottom arm IGBT T4. The reference character VVB' represents a V-phase bottom arm control signal, which is inputted through a V-phase bottom arm control signal input terminal P5 and transferred to the all-off circuit LG1, to the bottom arm driving circuit KT, and to the V-phase bottom arm IGBT T5. The reference character VWB' represents a W-phase bottom arm control signal, which is inputted through a W-phase bottom arm control signal input terminal P6 and transferred to the all-off circuit LG1, to the bottom arm driving circuit KT, and to the W-phase bottom arm IGBT T6. The six control signals VUT', VVT', VWT', VUB', VVB' and VWB' are outputted by a controlling semiconductor device 7C having a dead time generating function.

A charge pump circuit CH generates a power supply voltage VCP for driving the upper arm IGBTs. Diodes D7 and D8 and capacitors C3 and C4 are external parts for the charge pump circuit CH. A clock signal VCL for the operation of the charge pump circuit CH is supplied to the charge pump circuit CH through a clock signal input terminal P12. The clock signal VCL is outputted by the controlling semiconductor device 7C with the dead time generating function.

An internal power supply circuit 11 generates a power supply voltage VB for the controlling semiconductor device 7C with the dead time generating function based on a driving circuit power supply voltage Vcc.

A Vcc undervoltage detecting circuit 14A monitors the driving circuit power supply voltage Vcc and outputs an undervoltage detection signal to a fault circuit 14C when the driving circuit power supply voltage Vcc falls to a threshold voltage or less. An overcurrent detecting circuit 14B outputs an overcurrent detection signal to the fault circuit 14C when the voltage of a shunt resistor Rs rises to a prescribed level or more. When the Vcc undervoltage detection signal from the Vcc undervoltage detecting circuit 14A or the overcurrent detection signal from the overcurrent detecting circuit 14B is received, the fault circuit 14C outputs an all-off signal VA to the all-off circuit LG1 while outputting a fault signal Vf to the controlling semiconductor device 7C with the dead time generating function through a fault signal output terminal P8. Upon reception of the all-off signal VA from the fault circuit 14C, the all-off circuit LG1 turns OFF all the IGBTs irrespective of the status (H or L) of the control signals VUT', VVT', VWT', VUB', VVB' and VWB'.

Incidentally, the reference characters C1, C2 and C5 in FIG. 16 denote capacitors for the stabilization of power supply.

In the conventional technology shown in FIG. 16, the controlling semiconductor device 7C with the dead time generating function and the six-input motor driving IC 10B, as separate components, are connected together generally by wiring on a printed circuit board. For example, when the conventional technology of FIG. 16 is employed for a fan motor of an air conditioner, the wiring (generally extending for approximately 5 cm-10 cm) is more susceptible to noise compared to wiring inside an IC. The ill effect of noise can be reduced if the length of the aforementioned wiring on the printed circuit board can be shortened. The temperature around the six-input motor driving IC 10B (IC with high power consumption) tends to get high. Meanwhile, the operating temperature range of the controlling semiconductor device 7C with the dead time generating function is narrower than that of the six-input motor driving IC 10B. Especially when the controlling semiconductor device 7C with the dead time generating function is implemented by a microcomputer, the maximum value of the operating ambient temperature is as low as approximately 80° C.-100° C., for example. Therefore, a considerably long distance has to be kept between the controlling semiconductor device 7C with the dead time generating function and the six-input motor driving IC 10B in order to prevent high temperature of the controlling semiconductor device 7C with the dead time generating function. As above, there exists a certain limit to the reduction of the ill effect of noise by shortening the distance between the controlling semiconductor device 7C with the dead time generating function and the six-input motor driving IC 10B.

A timing chart of the 180-degree sine wave drive as a conventional technology will be explained referring to FIG. 17. FIG. 17 shows the timing chart of the 180-degree sine wave drive just for one phase (U-phase). In the U-phase top arm control signal VUT' and the U-phase bottom arm control signal VUB' shown in FIG. 17, "H" represents an ON signal and "L" represents an OFF signal. A dead time Td' is secured between an ON signal of a control signal and that of the other control signal. The dead time Td' is a time for preventing the top and bottom arms from simultaneously turning ON and breaking.

A case where noise is added to a control signal in the conventional 180-degree sine wave drive technology will be explained referring to FIG. 18. The difference from FIG. 17 is the existence of noise added to the U-phase top arm control signal VUT'. The noise is added during an OFF period of the U-phase top arm control signal VUT'. Due to a leap in the electric potential caused by the noise, the U-phase top arm turns ON at this point in time and a short circuit occurs to the top and bottom arms for a period Tx.

An inverter module having three control signal input terminals has been described in JP-A-2001-327171 (hereinafter referred to as a "patent document #1"). As described in the patent document #1, the inverter module includes a plurality of components placed in a casing formed of epoxy resin, etc. The components are connected together by wiring. The inverter module with three control signal input terminals receives three control signals and immediately generates six control signals with the dead time. The six control signals with the dead time travel through wiring inside an inverter module. The inverter module is in a shape like a rectangular parallelepiped with a maximum length (longest side) of approximately 10 cm-20 cm. Therefore, the longest line included in the wiring connecting the components and carrying the six control signals with the dead time extends for as long as approximately 5 cm-10 cm. Thus, the susceptibility of the line to the noise is equivalent to that of the aforementioned wiring connecting the six-input motor driving IC 10B and the controlling semiconductor device 7C with the dead time generating function in the conventional 180-degree sine wave drive technology shown in FIG. 16.

As above, the invention disclosed in the patent document #1 was made for the purpose of miniaturization and cost reduction of the inverter module, not for realizing countermeasures against the aforementioned noise.

In cases of inverter modules, breakage of the module due to a short circuit of the top and bottom arms is prevented generally by providing the inverter module with a short-circuit protection device, as described also in the patent document #1.

While a short circuit of the top and bottom arms occurring due to an abnormality in a control signal caused by noise has been explained referring to FIG. 18, the short of the top and bottom arms due to a control signal abnormality can be caused by a different mechanism. In the conventional 180-degree sine wave drive technology shown in FIG. 16, the power supply voltage VB for the controlling semiconductor device 7C with the dead time generating function is supplied by the six-input motor driving IC 10B. In this case, upon startup (rise) of the power supply voltage Vcc for the six-input motor driving IC 10B, the power supply voltage VB for the controlling semiconductor device 7C rises a little after the rise of Vcc. Thus, a time period in which the six-input motor driving IC 10B is already in an operable state (with the power supply voltage Vcc already risen) but the controlling semiconductor device 7C with the dead time generating function has not started outputting the control signals (with the power supply voltage VB not risen sufficiently or risen just for an insufficient time) can occur temporarily. In such cases, the six control signals remain indefinite, which can cause "top-bottom short-circuit" (simultaneous ON state of the top and bottom arms, letting through the so-called "through current") of the six-input motor driving IC 10B.

SUMMARY OF THE INVENTION

As described above, the conventional technology involves the following problems. First, a short circuit occurs to the top and bottom arms of the six-input motor driving IC 10B when noise is added to the six control signals. As a countermeasure against this problem, the breakage in the event of a short of the top and bottom arms can be prevented by, for example, increasing the tolerance of each arm of the six-input motor driving IC 10B to a short (so that each arm can withstand a short circuit continuing for a short period of time) and equipping the six-input motor driving IC 10B with a short-circuit protection device which turns OFF the arms immediately after the occurrence of the short of the top and bottom arms, as being employed for inverter modules. However, such a countermeasure, causing increase in the size and cost of the system, can not be taken for systems or purposes strongly requiring miniaturization and cost/price reduction (e.g. fan motors of air conditioners).

Second, in the conventional technology, a short can occur to the top and bottom arms of the six-input motor driving IC 10B before the controlling semiconductor device 7C with the dead time generating function starts outputting the control signals. It is of course possible to address this problem by preparing a power supply (voltage: VB) separately for the controlling semiconductor device 7C with the dead time generating function (without making the six-input motor driving IC 10B supply power to the controlling semiconductor device 7C) and setting the startup (rise) of the power supply voltage VB earlier than that of the power supply voltage Vcc for the six-input motor driving IC 10B while setting the shutdown (fall) of the power supply voltage VB later than that of the power supply voltage Vcc. Actually, in large-scale inverter devices employing an inverter module, power of a controller (for controlling the inverter module) is supplied not from the inverter module but from a separate power supply. However, such an additional power supply is undesirable for systems or purposes strongly requiring miniaturization and cost/price reduction (e.g. fan motors of air conditioners). Thus, it is desirable to eliminate the problem (short circuit of the top and bottom arms before the output of the control signals from the controlling semiconductor device 7C) while making the six-input motor driving IC 10B supply the power to the controlling semiconductor device 7C with the dead time generating function.

Third, the controlling semiconductor device 7C with the dead time generating function in the conventional technology is required to have the function of generating the six control signals as well as the function of generating the dead time. Having to output at least six control signals, the controlling semiconductor device 7C needs a large number of pins. Therefore, a relatively large-sized and expensive package has to be employed for the controlling semiconductor device.

The present invention has been made in consideration of the above problems. It is therefore the primary object of the present invention to provide a semiconductor device for driving a motor (e.g. motor driving IC) capable of preventing the short circuit of the top and bottom arms even when noise is added to the six control signals for controlling the six switching elements. Another object of the present invention is to provide a three-phase motor, a motor driving apparatus and a fan motor which are equipped with such a semiconductor device.

In order to achieve the above object, a semiconductor device for driving a motor in accordance with an aspect of the present invention comprises: six switching elements for driving a three-phase motor; three output terminals for outputting voltages to the three-phase motor; at least one driving circuit for driving the six switching elements; three control signal input terminals; and a function of generating six control signals for control of the six switching elements based on three control signals inputted through the three control signal input terminals. The semiconductor device for driving a motor is sealed with resin as one package.

In accordance with another aspect of the present invention, there is provided a motor driving apparatus comprising: the above semiconductor device for driving a motor; and a controlling semiconductor device for outputting the three control signals to the semiconductor device for driving a motor.

In accordance with another aspect of the present invention, there is provided a three-phase motor comprising the above motor driving apparatus installed therein.

In accordance with another aspect of the present invention, there is provided a fan motor for sending air to an indoor heat exchanger or an outdoor heat exchanger of an air conditioner having a compressor for compressing a refrigerant, the indoor heat exchanger for indoor heat exchange of the refrigerant, and the outdoor heat exchanger for outdoor heat exchange of the refrigerant. The fan motor is implemented by the above three-phase motor. In other words, the fan motor comprises the above motor driving apparatus installed therein.

By the present invention, the short circuit of the top and bottom arms due to noise to the six control signals can be prevented. Thanks to the reduction of the number of control signals (supplied from the controlling semiconductor device to the semiconductor device for driving a motor) from six to three, miniaturization and cost reduction of a system becomes possible. Since the dead time is generated inside the three-input motor driving IC (the semiconductor device for driving a motor), the top-bottom arm short-circuit before the controlling semiconductor device starts outputting the control signals can be prevented. Further, the dead time can be set at a small value (short time), by which waveform distortion, occurring to the electric current of a motor when the motor is driven by the sine wave drive, can be reduced.

Other objects, features and advantages of the invention will become apparent from the following description of the embodiments of the invention taken in conjunction with accompanying drawings.

DETAILED DESCRIPTION OF THE INVENTION

Figure 1:
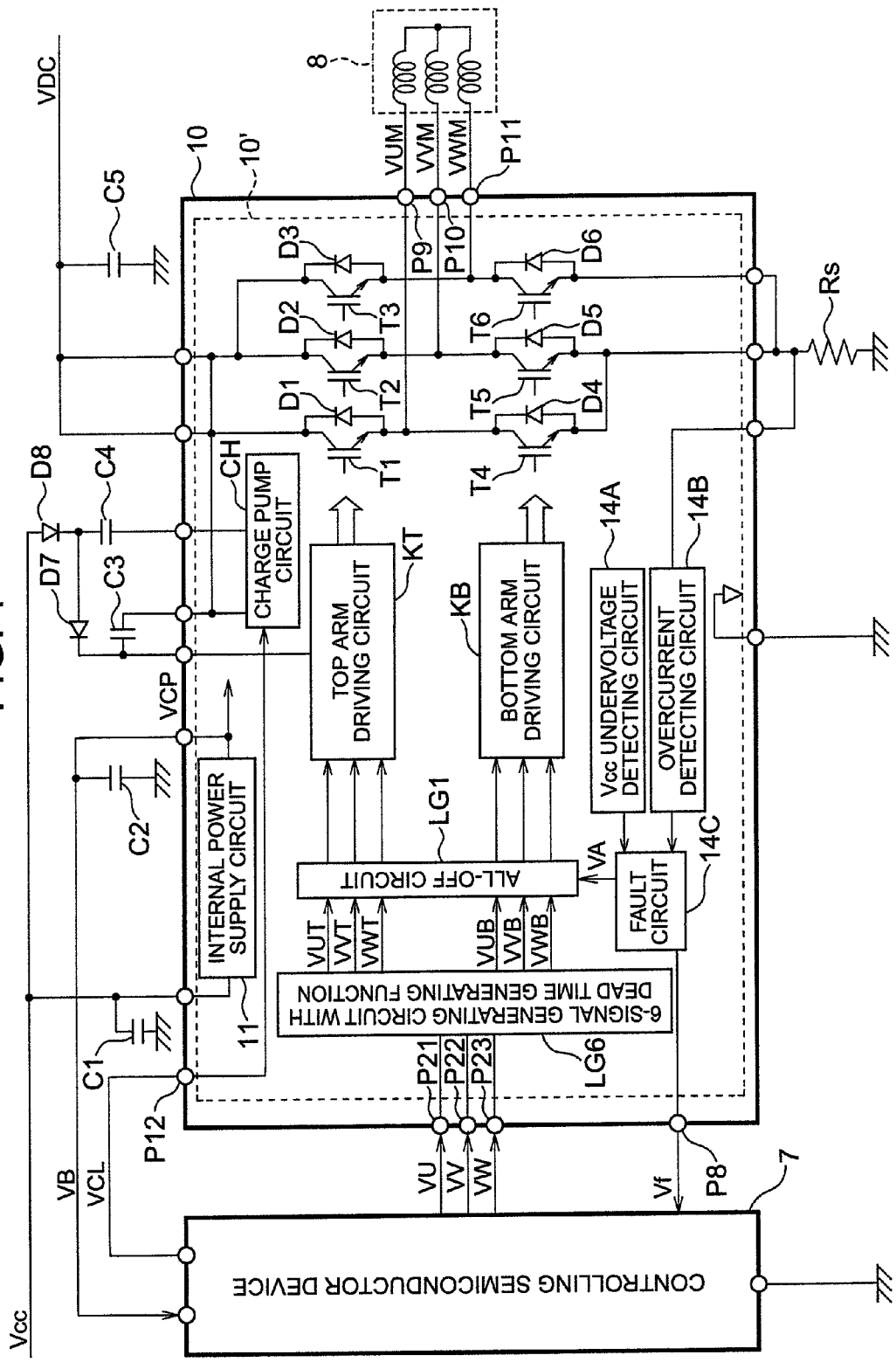
FIG. 1 is a schematic block diagram showing a first embodiment in accordance with the present invention.

Referring now to the drawings, a description will be given in detail of preferred embodiments in accordance with the present invention.

Embodiment 1

FIG. 1 is a schematic block diagram showing a first embodiment in accordance with the present invention.

As shown in FIG. 1, a motor driving semiconductor device 10 having three input terminals P21, P22 and P23 (hereinafter referred to as a "three-input motor driving IC 10") includes a motor driving semiconductor chip 10' having the three input terminals. In FIG. 1, the reference characters T1-T6 denote six switching elements for driving a three-phase motor. In the example of FIG. 1, each switching element is implemented by an IGBT (Insulated Gate Bipolar Transistor). The reference characters D1-D6 denote flywheel diodes which are connected in antiparallel with the IGBTs, respectively. The reference characters P9, P10 and P11 denote a U-phase output terminal, a V-phase output terminal and a W-phase output terminal. The output terminals P9, P10 and P11 are connected to coils 8 of the motor.

The reference character VU represents a U-phase control signal, VV represents a V-phase control signal, and VW represents a W-phase control signal. The control signals VU, VV and VW are inputted to a 6-signal generating circuit LG6 having a dead time generating function.

The 6-signal generating circuit LG6 with the dead time generating function generates a U-phase top arm control signal VUT and a U-phase bottom arm control signal VUB (based on the U-phase control signal VU), a V-phase top arm control signal VVT and a V-phase bottom arm control signal VVB (based on the V-phase control signal VV), and a W-phase top arm control signal VWT and a W-phase bottom arm control signal VWB (based on the W-phase control signal VW).

The U-phase top arm control signal VUT is transmitted from the 6-signal generating circuit LG6 with the dead time generating function to an all-off circuit LG1, to a top arm driving circuit KT, and to the U-phase top arm IGBT T1. The U-phase bottom arm control signal VUB is transmitted from the 6-signal generating circuit LG6 with the dead time generating function to the all-off circuit LG1, to a bottom arm driving circuit KB, and to the U-phase bottom arm IGBT T4. The V-phase top arm control signal VVT is transmitted from the 6-signal generating circuit LG6 with the dead time generating function to the all-off circuit LG1, to the top arm driving circuit KT, and to the V-phase top arm IGBT T2. The V-phase bottom arm control signal VVB is transmitted from the 6-signal generating circuit LG6 with the dead time generating function to the all-off circuit LG1, to the bottom arm driving circuit KB, and to the V-phase bottom arm IGBT T5. The W-phase top arm control signal VWT is transmitted from the 6-signal generating circuit LG6 with the dead time generating function to the all-off circuit LG1, to the top arm driving circuit KT, and to the W-phase top arm IGBT T3. The W-phase bottom arm control signal VWB is transmitted from the 6-signal generating circuit LG6 with the dead time generating function to the all-off circuit LG1, to the bottom arm driving circuit KB, and to the W-phase bottom arm IGBT T6.

A charge pump circuit CH shown in FIG. 1 is a circuit for generating a power supply voltage VCP for driving the upper arm IGBTs. Diodes D7 and D8 and capacitors C3 and C4 are external parts for the charge pump circuit CH. A clock signal VCL for the operation of the charge pump circuit CH is inputted to the charge pump circuit CH through a clock signal input terminal P12. The clock signal VCL is supplied from a controlling semiconductor device 7. An internal power supply circuit 11 generates a power supply voltage VB for the controlling semiconductor device 7 based on a driving circuit power supply voltage Vcc.

A Vcc undervoltage detecting circuit 14A monitors the driving circuit power supply voltage Vcc and outputs an undervoltage detection signal to a fault circuit 14C when the driving circuit power supply voltage Vcc falls to a threshold voltage or less. An overcurrent detecting circuit 14B outputs an overcurrent detection signal to the fault circuit 14C when the voltage of a shunt resistor Rs rises to a prescribed level or more. When the Vcc undervoltage detection signal from the Vcc undervoltage detecting circuit 14A or the overcurrent detection signal from the overcurrent detecting circuit 14B is received, the fault circuit 14C outputs an all-off signal VA to the all-off circuit LG1 while outputting a fault signal Vf to the controlling semiconductor device 7 through a fault signal output terminal P8. When the undervoltage state or the overcurrent state ends, the fault circuit 14C stops outputting the all-off signal VA and the fault signal Vf. Upon reception of the all-off signal VA from the fault circuit 14C, the all-off circuit LG1 turns OFF all the IGBTs irrespective of the status (H or L) of the control signals VUT, VVT, VWT, VUB, VVB and VWB.

The controlling semiconductor device 7 is supplied with the power supply voltage VB and the fault signal Vf from the three-input motor driving IC 10, while supplying the three control signals VU, VV and VW and the clock signal VCL for the charge pump circuit CH to the three-input motor driving IC 10. The controlling semiconductor device 7 may be implemented either by a general-purpose microcomputer or a special-purpose IC for driving a motor.

Since the six control signals (VUT, VVT, VWT, VUB, VVB, VWB) and the dead time are generated by the three-input motor driving IC 10, the controlling semiconductor device 7 is relieved of the need of having the dead time generating function and the function of generating the six control signals. Further, thanks to the reduction of the number of control signal output terminals from 6 to 3, a package with a smaller number of pins can be used, by which miniaturization and cost reduction of the controlling semiconductor device 7 can be realized as compared to the controlling semiconductor device 7C employed in the conventional technology.

The reference characters C1, C2 and C5 in FIG. 1 denote capacitors for the stabilization of power supply.

Incidentally, while IGBTs are used as the switching elements T1-T6 in FIG. 1, the switching elements T1-T6 may also be implemented by other switching elements like MOSFETs or bipolar transistors. While a charge pump system is employed in FIG. 1 for the driving of the top arms, other systems (e.g. bootstrap system) may also be employed.

Figure 2:
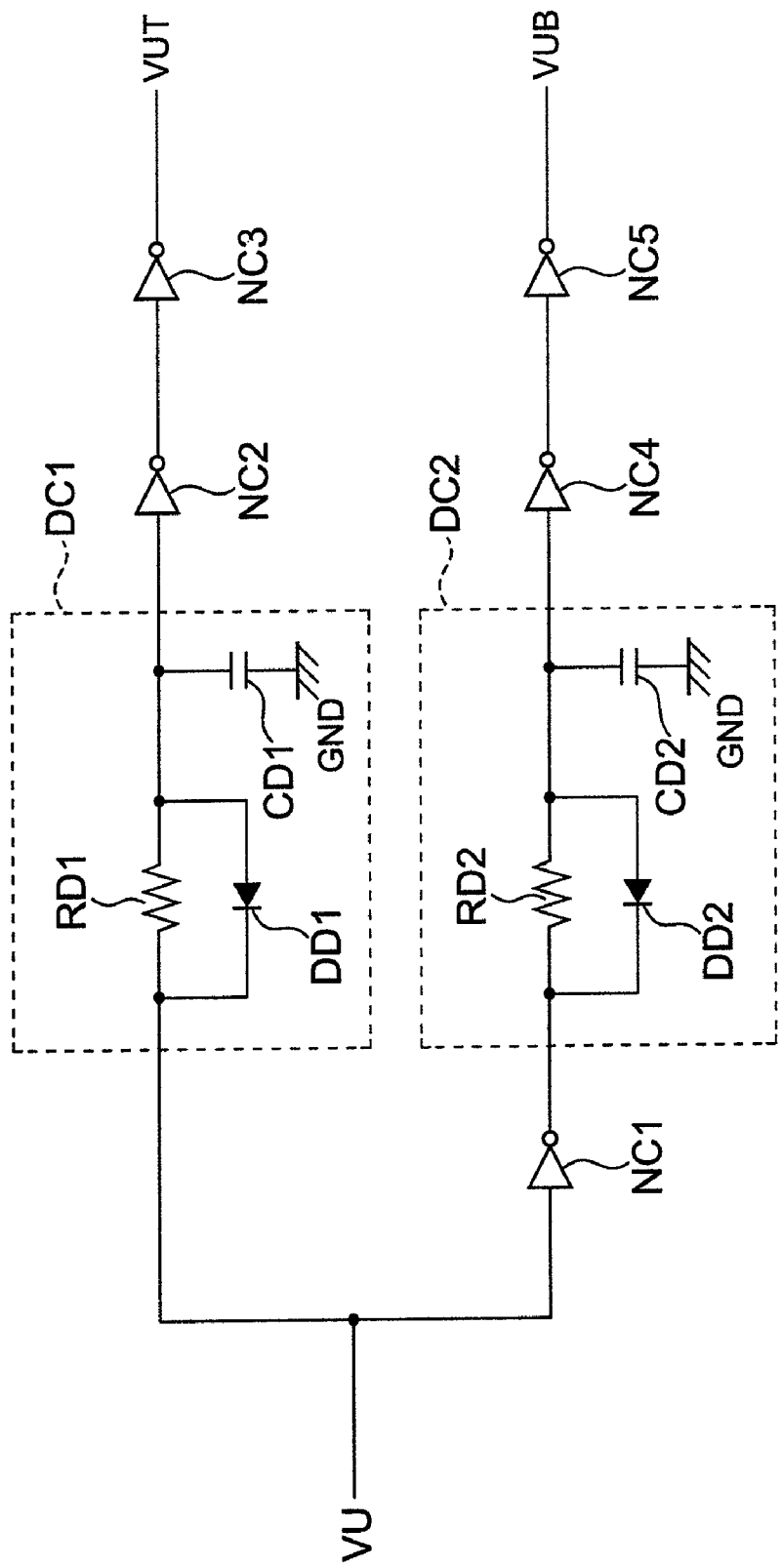
FIG. 2 is a circuit diagram showing a first example of a 6-signal generating circuit with a dead time generating function (for one phase) employed in the first embodiment.

Next, the details of the 6-signal generating circuit LG6 with the dead time generating function will be described. FIG. 2 is a circuit diagram showing a first example of the 6-signal generating circuit LG6 with the dead time generating function. In FIG. 2, only a circuit for the U-phase (among the three phases U, V and W) is shown. The circuit of FIG. 2 includes NOT circuits NC1, NC2, NC3, NC4 and NC5 and ON delay circuits DC1 and DC2. The ON delay circuit DC1 includes a resistor RD1, a capacitor CD1 and a diode DD1. Similarly, the ON delay circuit DC2 includes a resistor RD2, a capacitor CD2 and a diode DD2.

Figure 3:
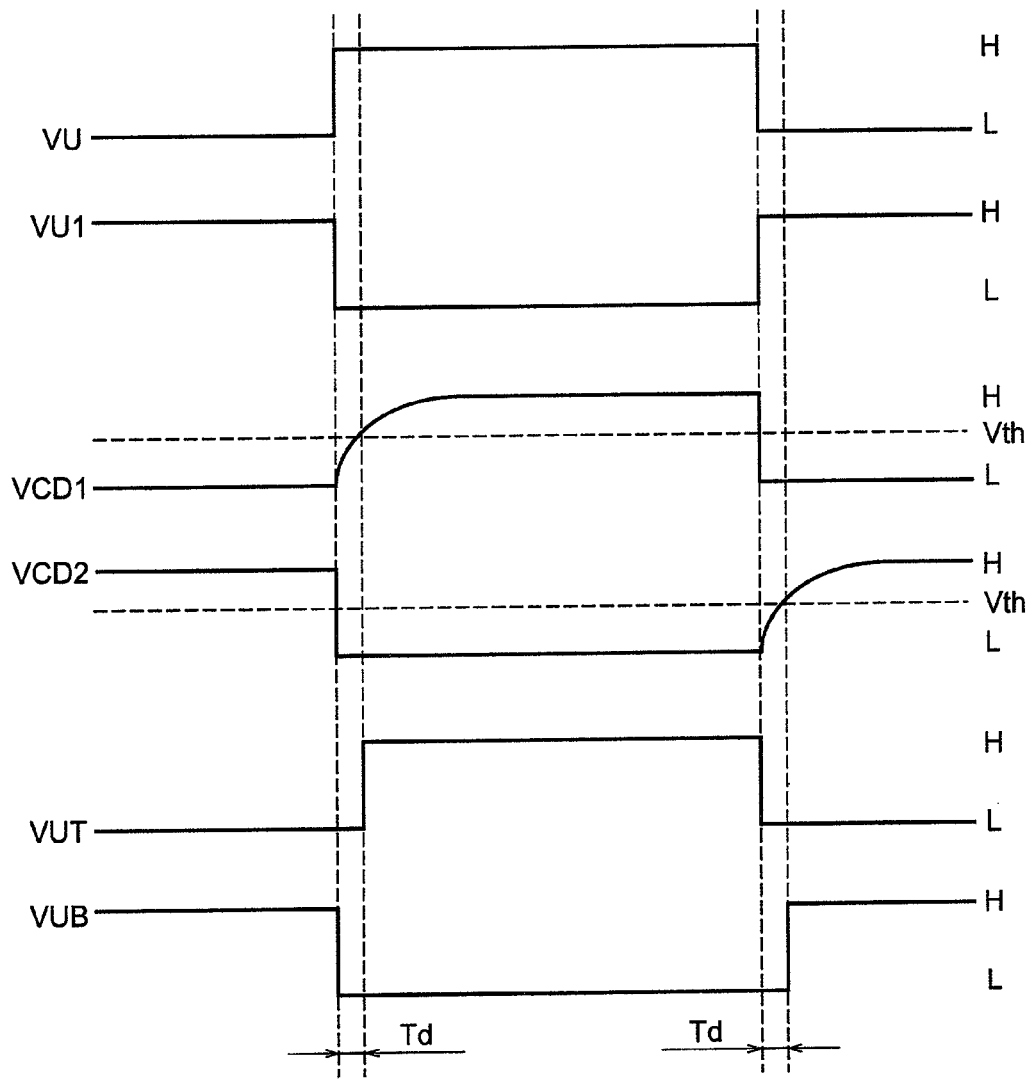
FIG. 3 is an example of timing charts of the 6-signal generating circuit with the dead time generating function (for one phase) shown in FIG. 2.

The operation of the 6-signal generating circuit LG6 with the dead time generating function shown in FIG. 2 will be described below. FIG. 3 is an example of timing charts of the 6-signal generating circuit LG6 with the dead time generating function (FIG. 2). In the U-phase top arm control signal VUT and the U-phase bottom arm control signal VUB shown in FIG. 3, "H" represents an ON signal, "L" represents an OFF signal, and VU represents the U-phase control signal. The NOT circuit NC1 receiving the U-phase control signal VU inverts the signal VU (between H and L) and outputs the inverted signal. The signal VU1 in FIG. 3 shows the output voltage of the NOT circuit NC1.

At the point when the U-phase control signal VU rises from L to H, the output voltage VU1 of the NOT circuit NC1 falls from H to L, by which the capacitor CD2 is electrically discharged and its voltage VCD2 drops. Since the electric discharge is made mainly through the diode DD2 and finishes in a short period of time, the voltage VCD2 of the capacitor CD2 falls from H to L quickly. Thus, upon the rise of the U-phase control signal VU from L to H, the U-phase bottom arm control signal VUB immediately falls from H to L.

At the same point when the U-phase control signal VU rises from L to H, the capacitor CD1 is charged and its voltage VCD1 rises. Since the electric charging is made mainly through the resistor RD1, the voltage VCD1 of the capacitor CD1 rises with a gentle gradient. When the voltage VCD1 exceeds a threshold voltage Vth of the NOT circuit NC2, the U-phase top arm control signal VUT rises from L to H. Thus, a delay time occurs between the rise of the U-phase control signal VU (from L to H) and the rise of the U-phase top arm control signal VUT (from L to H). The delay time becomes the dead time Td.

At the point when the U-phase control signal VU falls from H to L, the capacitor CD1 is discharged and its voltage VCD1 falls. Since the electric discharge is made mainly through the diode DD1 and finishes in a short period of time, the voltage VCD1 of the capacitor CD1 falls from H to L quickly. Thus, upon the fall of the U-phase control signal VU from H to L, the U-phase top arm control signal VUT immediately falls from H to L.

At the same point when the U-phase control signal VU falls from H to L, the output voltage VU1 of the NOT circuit NC1 rises from L to H, by which the capacitor CD2 is charged and its voltage VCD2 rises. Since the electric charging is made mainly through the resistor RD2, the voltage VCD2 of the capacitor CD2 rises with a gentle gradient. When the voltage VCD2 exceeds a threshold voltage Vth of the NOT circuit NC4, the U-phase bottom arm control signal VUB rises from L to H. Thus, a delay time occurs between the fall of the U-phase control signal VU (from H to L) and the rise of the U-phase bottom arm control signal VUB (from L to H). The delay time becomes the dead time Td.

As above, the first example of the 6-signal generating circuit LG6 with the dead time generating function (FIG. 2) generates the dead time by letting each ON delay circuit (DC1, DC2) have an ON delay time (when the output of the ON delay circuit turns ON) that is longer than an OFF delay time (when the output of the ON delay circuit turns OFF).

Incidentally, while a resistor is used in each ON delay circuit (DC1, DC2) shown in FIG. 2, on-state resistance of a MOS (Metal-Oxide Semiconductor), operating in the same way as the resistor, may also be used.

Figure 4:
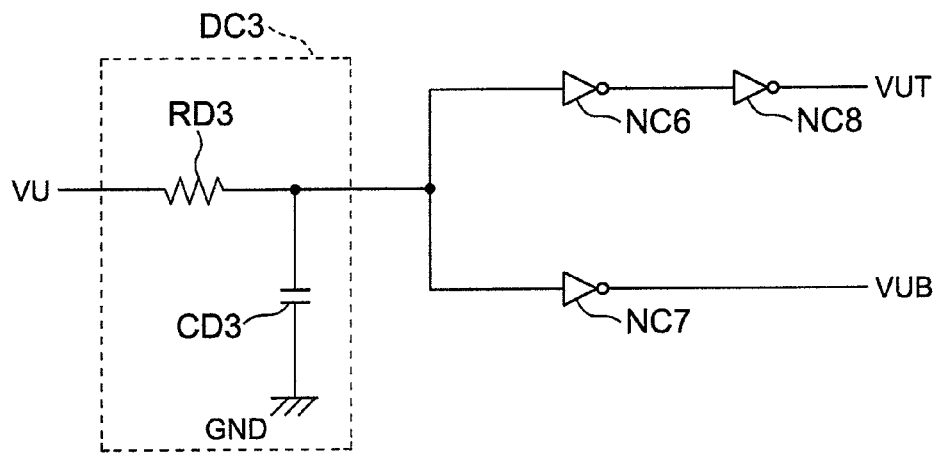
FIG. 4 is a circuit diagram showing a second example of the 6-signal generating circuit with the dead time generating function (for one phase) employed in the first embodiment.

FIG. 4 is a circuit diagram showing a second example of the 6-signal generating circuit LG6 with the dead time generating function. In FIG. 4, only a circuit for the U-phase (among the three phases U, V and W) is shown. The circuit of FIG. 4 includes NOT circuits NC6, NC7 and NC8 and a delay circuit DC3. The delay circuit DC3 includes a resistor RD3 and a capacitor CD3. A threshold voltage Vth6 of the NOT circuit NC6 is set higher than that (Vth7) of the NOT circuit NC7 (Vth6>Vth7).

Figure 5:
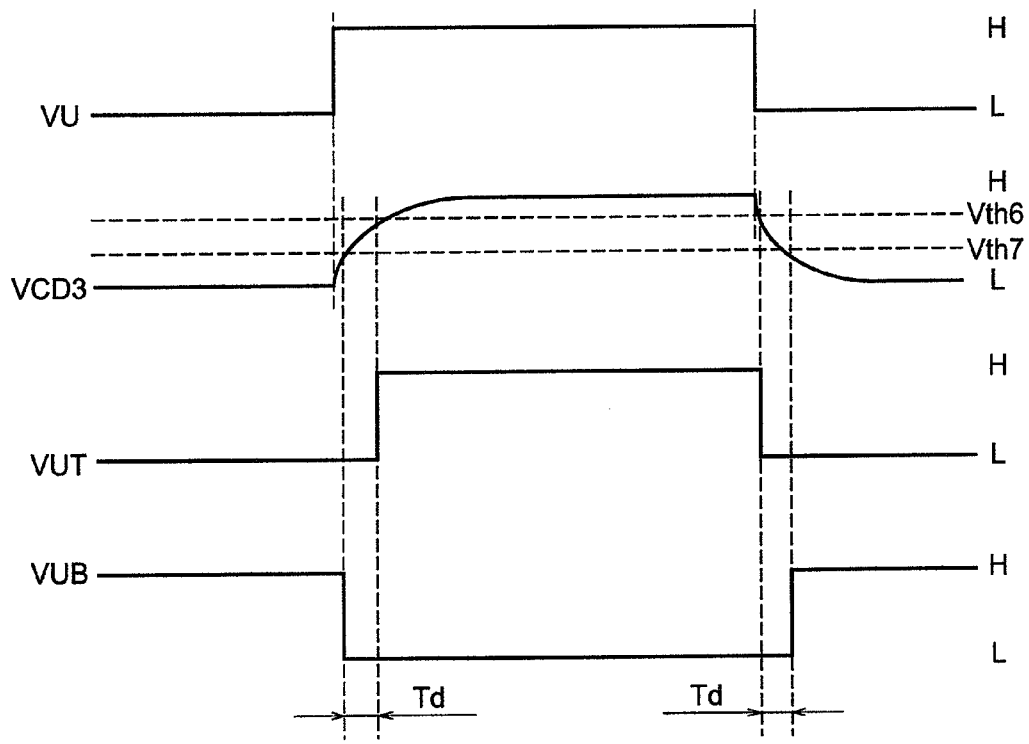
FIG. 5 is an example of timing charts of the 6-signal generating circuit with the dead time generating function (for one phase) shown in FIG. 4.

The operation of the 6-signal generating circuit LG6 with the dead time generating function shown in FIG. 4 will be explained below. FIG. 5 is an example of timing charts of the 6-signal generating circuit LG6 with the dead time generating function (FIG. 4). In the U-phase top arm control signal VUT and the U-phase bottom arm control signal VUB shown in FIG. 5, "H" represents an ON signal and "L" represents an OFF signal.

At the point when the U-phase control signal VU rises from L to H, the capacitor CD3 is charged and its voltage VCD3 rises. Since the electric charging of the capacitor CD3 is made through the resistor RD3, the voltage VCD3 of the capacitor CD3 rises with a gentle gradient. When the voltage VCD3 exceeds the threshold voltage Vth7 of the NOT circuit NC7, the U-phase bottom arm control signal VUB falls from H to L. Thereafter, when the voltage VCD3 of the capacitor CD3 exceeds the threshold voltage Vth6 of the NOT circuit NC6, the U-phase top arm control signal VUT rises from L to H. The delay time, between the first point when the voltage VCD3 of the capacitor CD3 exceeds the threshold voltage Vth7 of the NOT circuit NC7 and the second point when the voltage VCD3 exceeds the threshold voltage Vth6 of the NOT circuit NC6, becomes the dead time Td.

At the point when the U-phase control signal VU falls from H to L, the capacitor CD3 is discharged and its voltage VCD3 falls. Since the electric discharge of the capacitor CD3 is made through the resistor RD3, the voltage VCD3 of the capacitor CD3 falls with a gentle gradient. When the voltage VCD3 falls below the threshold voltage Vth6 of the NOT circuit NC6, the U-phase top arm control signal VUT falls from H to L. Thereafter, when the voltage VCD3 of the capacitor CD3 falls below the threshold voltage Vth7 of the NOT circuit NC7, the U-phase bottom arm control signal VUB rises from L to H. The delay time, between the first point when the voltage VCD3 of the capacitor CD3 falls below the threshold voltage Vth6 of the NOT circuit NC6 and the second point when the voltage VCD3 falls below the threshold voltage Vth7 of the NOT circuit NC7, becomes the dead time Td.

As above, the second example of the 6-signal generating circuit LG6 with the dead time generating function (FIG. 4) generates the dead time by use of the gentle rise and fall implemented by the delay circuit DC3 and the difference between the threshold voltages Vth6 and Vth7 of the NOT circuits NC6 and NC7.

Incidentally, while a resistor is used in the circuit of FIG. 4, the on-state resistance of a MOS, operating in the same way as the resistor, may also be used.

Figure 6:
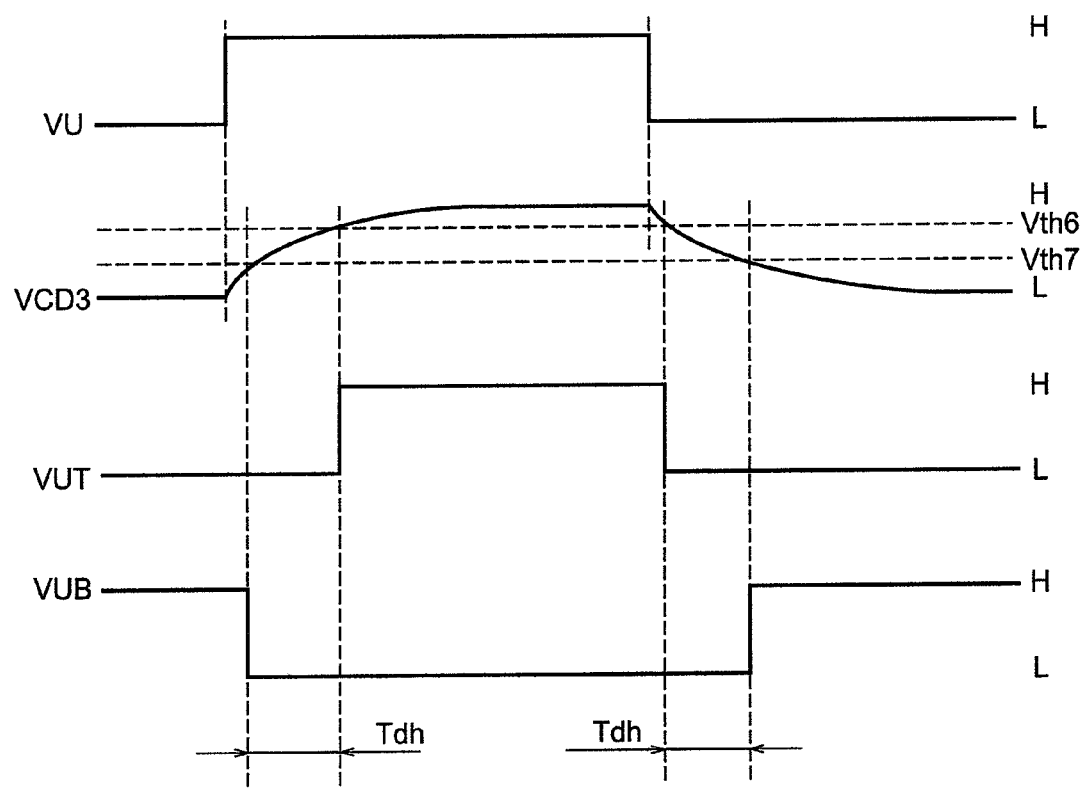
FIG. 6 is an example of timing charts of the 6-signal generating circuit with the dead time generating function (for one phase) shown in FIG. 4 at high temperatures.

Next, the operation of the 6-signal generating circuit LG6 with the dead time generating function (FIG. 4) at high temperatures will be explained. FIG. 6 is an example of timing charts of the 6-signal generating circuit LG6 with the dead time generating function (FIG. 4) at high temperatures. In the U-phase top arm control signal VUT and the U-phase bottom arm control signal VUB shown in FIG. 6, "H" represents an ON signal and "L" represents an OFF signal.

Since the resistance of a resistor inside an IC generally has positive temperature dependence, the resistance increases as the temperature of the IC rises. Thus, when the temperature of the 6-signal generating circuit LG6 with the dead time generating function (FIG. 4) is elevated, the resistance of the resistor RD3 increases and the gradients of the rise and fall of the voltage VCD3 of the capacitor CD3 get smaller than those at low temperatures. Therefore, a dead time Tdh generated at a high temperature is longer than the dead time Td generated at a low temperature. In other words, the dead time has positive temperature dependence.

The circuit of FIG. 2 employs resistors similarly to the circuit of FIG. 4, and thus the dead time generated by the circuit of FIG. 2 also has positive temperature dependence.

Also when the on-state resistance of a MOS is used instead of each resistor in the circuits of FIGS. 2 and 4, the dead time generated by each circuit has positive temperature dependence since the on-state resistance of a MOS generally has positive temperature dependence.

Next, effects of the positive temperature dependence of the dead time will be described. The switching time of an output-stage switching element used for an inverter generally increases as the temperature rises. Thus, in the setting of the dead time, the increase of the switching time at high temperatures has to be taken into consideration.

In the configuration of FIG. 1 (first embodiment), the 6-signal generating circuit LG6 with the dead time generating function and the IGBTs T1-T6 at the output stage are placed on one chip, and thus the temperature of the 6-signal generating circuit LG6 with the dead time generating function substantially equals that of the output-stage IGBTs T1-T6.

Meanwhile, the dead time has positive temperature dependence when the circuit shown in FIG. 2 or FIG. 4 is used for the 6-signal generating circuit LG6 with the dead time generating function. In such cases where the dead time has positive temperature dependence, the dead time at a temperature higher than room temperature is longer than the dead time at room temperature. Thus, the dead time at room temperature may be set without incorporating the increase of the switching time at high temperatures since the dead time (having the positive temperature dependence) naturally increases along with the temperature rise and covers the increase of the switching time.

Assuming that the dead time has no temperature dependence, the dead time at high temperatures remains equal to the dead time at room temperature. In this case, the dead time at room temperature has to be set at a large value (long time) that incorporates the increase of the switching time at high temperatures. A long dead time has various disadvantages. For example, in the sine wave drive of a motor, serious waveform distortion can be caused to the motor current.

On the other hand, the configuration of this embodiment, in which the dead time has positive temperature dependence and the temperature of the dead time generating circuit is close to that of the output-stage switching elements, is advantageous in that the dead time can be set at a small value (short time).

Figure 8:
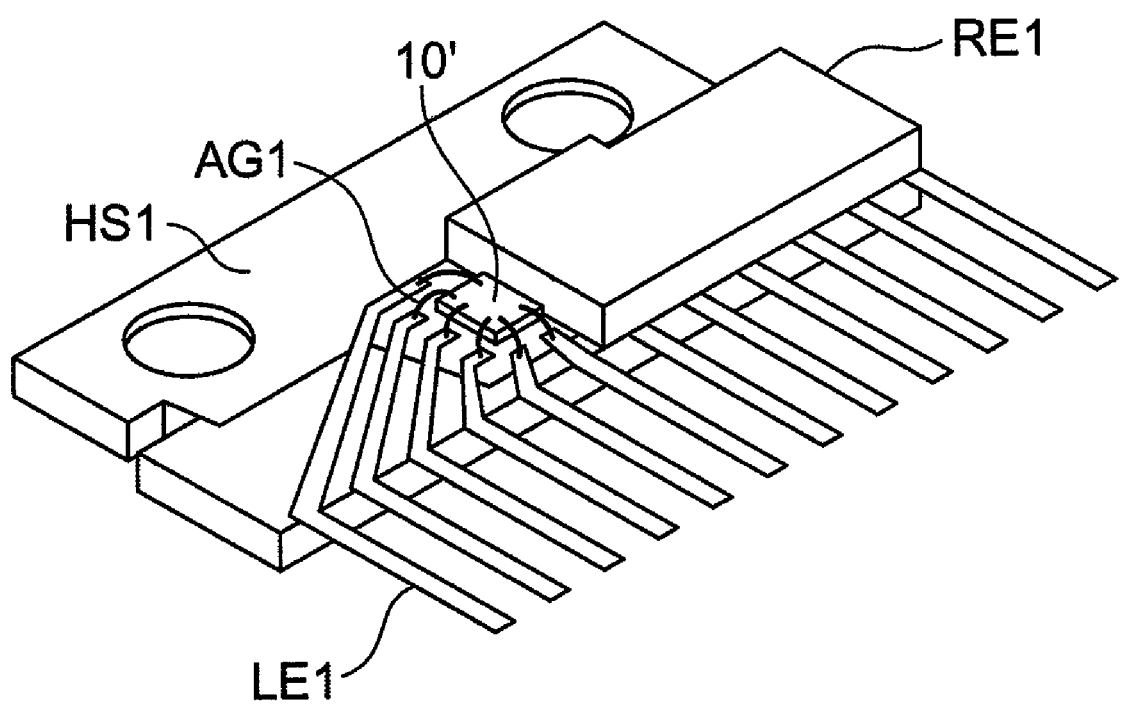
FIG. 8 is a perspective view showing an example of the structure of a three-input motor driving IC (motor driving semiconductor device) employed in the first embodiment.

Next, the structure of the three-input motor driving IC 10 will be described. FIG. 8 is a perspective view showing an example of the structure of the three-input motor driving IC 10. The three-input motor driving IC 10 of FIG. 8 includes a radiating fin HS1, leads LE1, the motor driving semiconductor chip 10' with three input terminals, a resin seal RE1 and gold wires AG1. Incidentally, while some of the leads LE1 are unshown (only twelve leads LE1 are shown) in FIG. 8, nineteen or more leads LE1 are actually used when the three-input motor driving IC 10 is configured as shown in FIG. 1 (with nineteen terminals). The motor driving semiconductor chip 10' with three input terminals is mounted on the radiating fin HS1 with solder, silver paste, etc. The motor driving semiconductor chip 10' with three input terminals is electrically connected to the leads LE1 by the gold wires AG1. The whole motor driving semiconductor chip 10', all the gold wires AG1, parts of the leads LE1 and part of the radiating fin HS1 are sealed with resin such as epoxide-based resin containing filler like silica. While the left half of the upper part of the IC is drawn without the resin seal in FIG. 8 in order to show the internal structure of the IC, the left-hand side part is actually sealed with resin similarly to the right-hand side part.

In cases where this embodiment is applied to a fan motor of an indoor or outdoor unit of an air conditioner, for example, the motor driving semiconductor chip 10' with three input terminals can be designed within a small area (with each side approximately 1.5 mm-7 mm long) since the rated current of each IGBT is as low as approximately 1 A-5 A. Thus, the three-input motor driving IC 10 after the resin sealing also becomes compact. The size of the resin-sealed part is approximately 1 cm-4 cm in width (longest side), 5 mm-3 cm in depth (length in the depth direction) and 2 mm-6 mm in thickness. The six control signals are transmitted only through part of the wiring on the IC chip. The length of a line (included in the wiring) on the IC chip carrying each of the six control signals is as short as several mm since the length of one side of the motor driving semiconductor chip 10' with three input terminals is approximately 1.5 mm-7 mm. Therefore, the wiring on the IC chip is substantially not affected by the noise and the "top-bottom short-circuit" (simultaneous ON state of the top and bottom arms, letting through the so-called "through current") due to the noise to the six control signals can be prevented.

The aforementioned conventional technology involves the problem that the six-input motor driving IC 10B can have a short circuit of the top and bottom arms before the controlling semiconductor device 7C with the dead time generating function starts outputting the control signals. On the other hand, in the configuration of the first embodiment (FIG. 1) in which the dead time is generated inside the three-input motor driving IC 10, no top-bottom short-circuit occurs even before the controlling semiconductor device 7 starts outputting the control signals. Therefore, even in cases where high reliability is required, the power of the controlling semiconductor device 7 can be supplied from the three-input motor driving IC 10 without the need of preparing a power supply separately for the controlling semiconductor device 7, by which the miniaturization and cost reduction of the system can be achieved.

Embodiment 2

Figure 12:
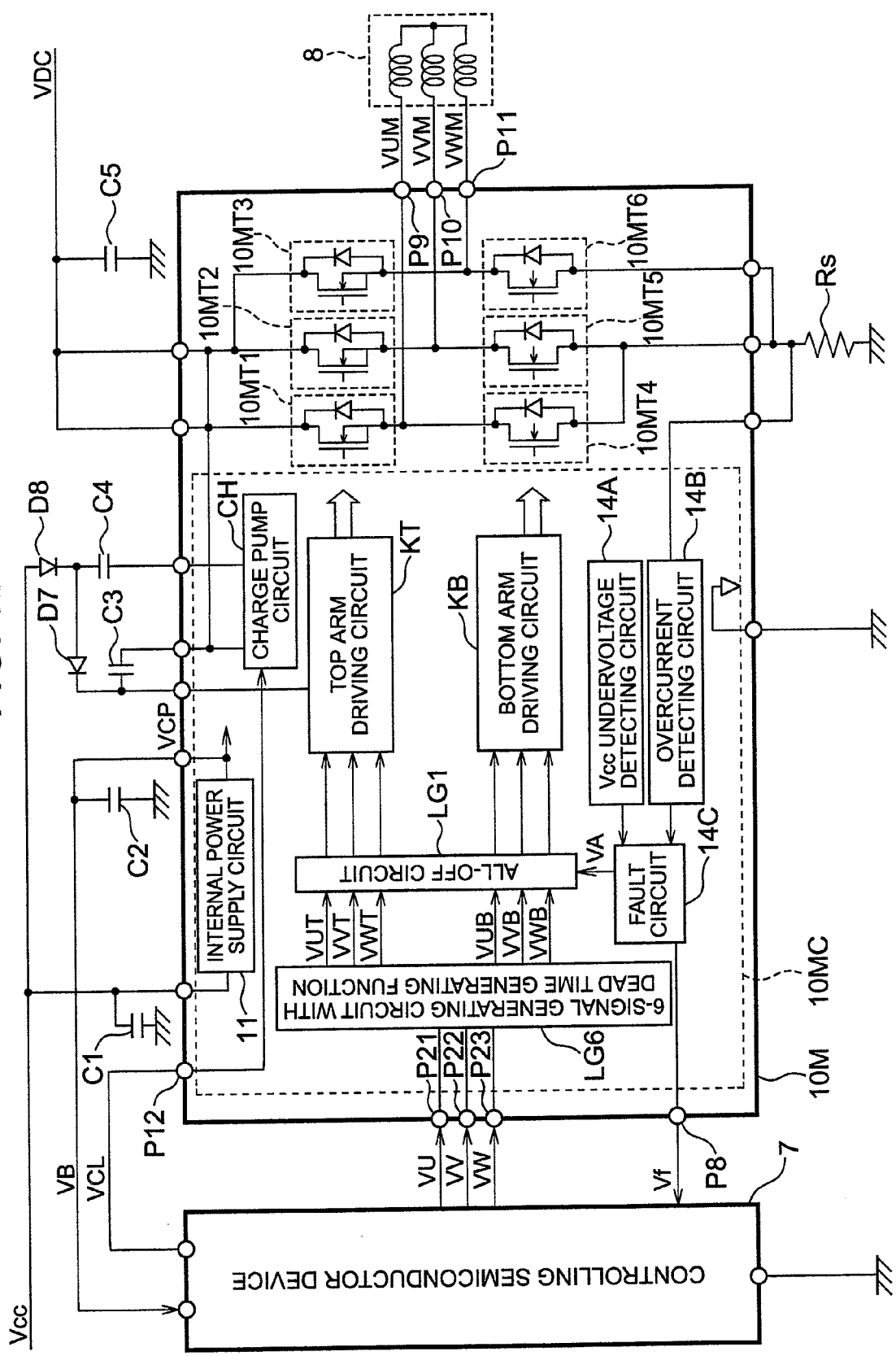
FIG. 12 is a schematic block diagram showing a second embodiment in accordance with the present invention.

FIG. 12 is a schematic block diagram showing a second embodiment in accordance with the present invention.

The second embodiment (FIG. 12) differs from the first embodiment (FIG. 1) in that the three-input motor driving IC 10M shown in FIG. 12 is made up of multiple chips. In FIG. 12, a chip 10MT1 is formed by a U-phase top arm MOSFET and a flywheel diode connected in antiparallel with the U-phase top arm MOSFET, a chip 10MT2 is formed by a V-phase top arm MOSFET and a flywheel diode connected in antiparallel with the V-phase top arm MOSFET, a chip 10MT3 is formed by a W-phase top arm MOSFET and a flywheel diode connected in antiparallel with the W-phase top arm MOSFET, a chip 10MT4 is formed by a U-phase bottom arm MOSFET and a flywheel diode connected in antiparallel with the U-phase bottom arm MOSFET, a chip 10MT5 is formed by a V-phase bottom arm MOSFET and a flywheel diode connected in antiparallel with the V-phase bottom arm MOSFET, a chip 10MT6 is formed by a W-phase bottom arm MOSFET and a flywheel diode connected in antiparallel with the W-phase bottom arm MOSFET, and a chip 10MC is formed by the other components of the three-input motor driving IC 10M. Incidentally, the flywheel diode of each chip 10MT1-10MT6 may also be implemented by a parasitic diode inside the MOSFET, without preparing a diode separately from the MOSFET.

All the chips are integrated into one IC by sealing the chips with resin such as epoxide-based resin containing filler like silica. The chips are electrically connected together by gold wires and inner leads (parts of the leads sealed with resin), for example.

In cases where this embodiment is applied to a fan motor of an indoor or outdoor unit of an air conditioner, for example, each chip 10MT1-10MT6 can be designed within a small area (with each side approximately 0.5 mm-3 mm long) since the rated current of each MOSFET is as low as approximately 1 A-5 A. Thus, the whole IC (formed by sealing all the chips with resin) also becomes compact. The size of the resin-sealed part of the package is approximately 2 cm-5 cm in width (longest side), 8 mm-3 cm in depth (length in the depth direction) and 2 mm-6 mm in thickness, which is almost equivalent to the size of the resin-sealed part of the package (three-input motor driving IC 10) of the first embodiment shown in FIG. 8.

Since the six control signals are transmitted only through part of the wiring on the IC chip (including the gold wires and inner leads for electrically connecting the chips together), the length of a line (included in the wiring) inside the IC carrying each of the six control signals can be kept within approximately 3 cm-4 cm at most. Therefore, the ill effect of the noise on the lines transmitting the six control signals is less than that on wires connecting the three-input motor driving IC 10M with the controlling semiconductor device 7. As above, the top-bottom short-circuit due to the noise to the six control signals can be prevented also by the configuration of this embodiment.

Incidentally, while the chips 10MT1-10MT6 and the chip 10MC (on which the 6-signal generating circuit LG6 with the dead time generating function is placed) are originally formed as different chips in this embodiment, the chips 10MT1-10MT6 and 10MC are integrated into one IC by sealing them with resin such as epoxide-based resin containing filler. The epoxide-based resin containing filler has relatively high thermal conductivity (0.1-3 W/mK) compared to air or gel surrounding switching elements of an inverter module. Thus, even though the MOSFETs and the 6-signal generating circuit LG6 with the dead time generating function are placed on different chips, the temperatures of the 6-signal generating circuit LG6 and the MOSFETs can be kept close thanks to the relatively high thermal conductivity. Therefore, similarly to the first embodiment, the configuration of the second embodiment is also advantageous in that the dead time can be set at a small value (short time) due to the positive temperature dependence of the dead time.

Incidentally, while MOSFETs are used as the switching elements in FIG. 12, the switching elements may also be implemented by those of other types like IGBTs or bipolar transistors. While a charge pump system is employed in FIG. 12 for the driving of the top arms, other systems (e.g. bootstrap system) may also be employed.

While the chip 10MC is equipped with circuits for the three phases (U, V, W) in the example of FIG. 12, the chip 10MC may also be designed as three different chips each of which is equipped with a circuit for one phase.

The other part of the second embodiment is similar to the first embodiment, and thus repeated explanation thereof is omitted here.

Embodiment 3

Figure 13:
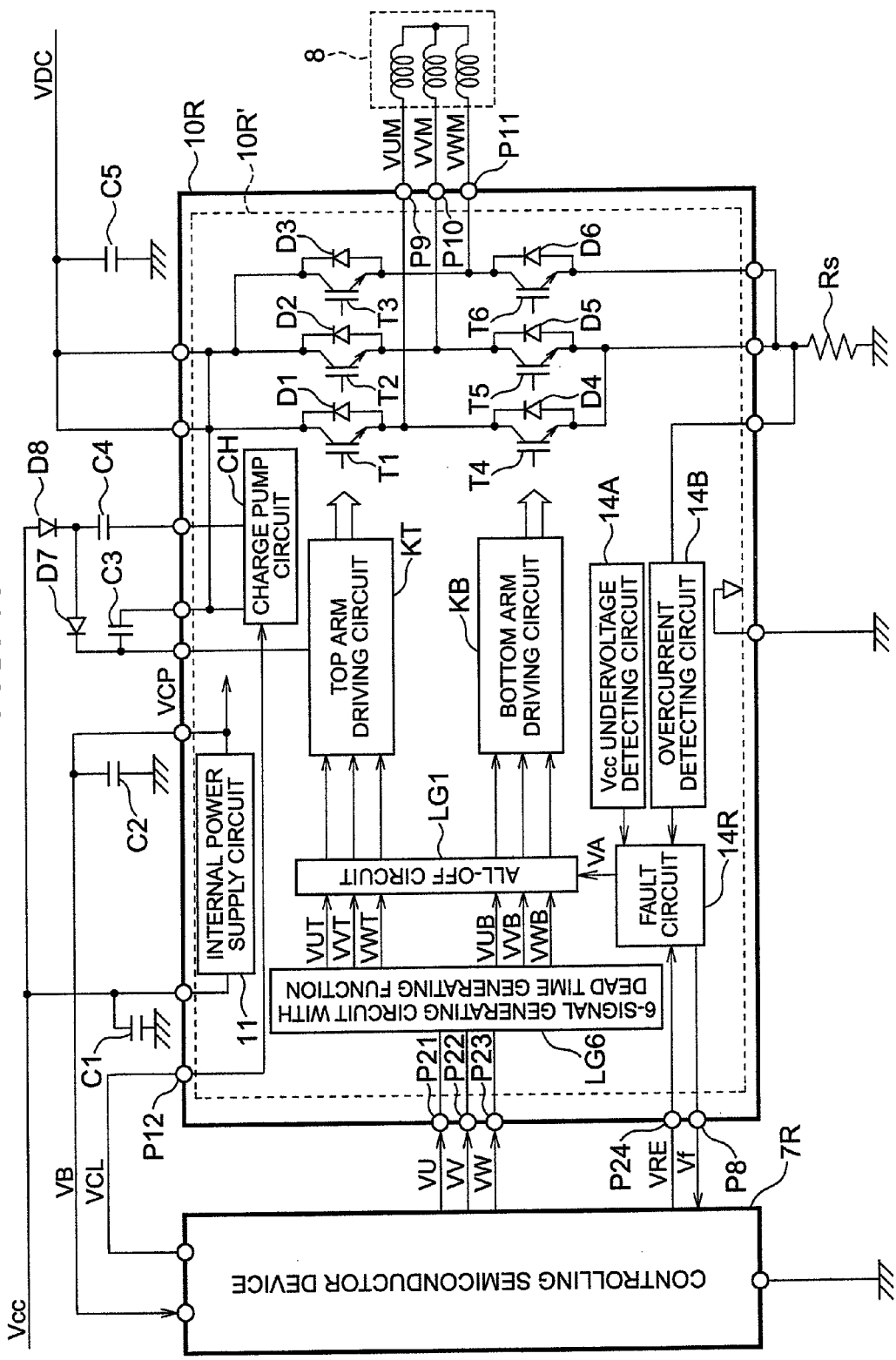
FIG. 13 is a schematic block diagram showing a third embodiment in accordance with the present invention.

FIG. 13 is a schematic block diagram showing a third embodiment in accordance with the present invention.

In the third embodiment, a three-input motor driving IC 10R is equipped with a reset signal input terminal P24, and a controlling semiconductor device 7R outputs a reset signal for canceling a protective function operating state of the three-input motor driving IC 10R. As the protective function, the three-input motor driving IC 10R has a Vcc undervoltage protection function and an overcurrent protection function. When the Vcc undervoltage detection signal from the Vcc undervoltage detecting circuit 14A or the overcurrent detection signal from the overcurrent detecting circuit 14B is received, the fault circuit 14R shown in FIG. 13 outputs the all-off signal VA to the all-off circuit LG1 while outputting the fault signal Vf to the controlling semiconductor device 7R through the fault signal output terminal P8. Even after the undervoltage state or the overcurrent state ends, the fault circuit 14R keeps on outputting the all-off signal VA and the fault signal Vf, that is, the protective function operating state is not canceled yet. The controlling semiconductor device 7R keeps on acquiring the information that the three-input motor driving IC 10R is in the protective operating state by the reception of the fault signal Vf. In order to cancel the protective function operating state, the controlling semiconductor device 7R outputs the reset signal VRE to the fault circuit 14R. The reset signal can be implemented by a pulse of a high electric potential (H) rising from a low electric potential (L) representing the normal state, for example. While the reset signal will hereinafter be assumed to be of this type (H pulse rising from the low level L) in the following explanation, the reset signal may of course be implemented by a signal of a different type, such as a pulse of a low electric potential (L) falling from a high electric potential (H) representing the normal state.

The fault circuit 14R cancels the protective function operating state (that is, stops outputting the all-off signal VA and the fault signal Vf) at the point when the pulse (reset signal) falls from H to L, for example. As above, in the third embodiment, the timing for canceling the protective operating state can be determined by the controlling semiconductor device 7R. Thus, it becomes possible to change the length of the time period between the activation and cancellation of the protection depending on various conditions, such as the temperature at which the protection was activated, the length of time between a (previous) protective operation and the next protective operation, etc. The reliability can be increased by, for example, extending the time period under conditions with a high probability of breakage.

In cases where the controlling semiconductor device 7R turns the electric potential (reset signal) to H while the protective function of the three-input motor driving IC 10R is inactive, the fault circuit 14R outputs the all-off signal VA and the fault signal Vf. This makes it possible to stop the inverter when an abnormal state of some kind is detected by the controlling semiconductor device 7R. The abnormal state that can be detected by the controlling semiconductor device 7R includes an overheated state, an overvoltage or undervoltage state of a high power supply voltage VDC, etc. A high-reliability system can be constructed by letting the controlling semiconductor device 7R detect such an abnormal state to stop the inverter.

Incidentally, when the objective is just the cancellation of the protective operating state, the fault circuit 14R may also be configured to let the inverter keep operating (irrespective of the status of the protective function) in cases where the electric potential (reset signal) turns to H while the protective function of the three-input motor driving IC 10R is inactive.

While an example of the fault circuit 14R not canceling the protective operating state even after the end of the undervoltage state or overcurrent state has been described above, the protective operating state may be automatically canceled by the three-input motor driving IC 10R after the end of the undervoltage state, while maintaining the protective operating state until the reset by the controlling semiconductor device 7R exclusively in cases where the overcurrent state has ended. Conversely, the protective operating state may be automatically canceled by the three-input motor driving IC 10R after the end of the overcurrent state, while maintaining the protective operating state until the reset by the controlling semiconductor device 7R exclusively in cases where the undervoltage state has ended.

The other part of the third embodiment is similar to the first embodiment, and thus repeated explanation thereof is omitted here.

Embodiment 4

Figure 14:
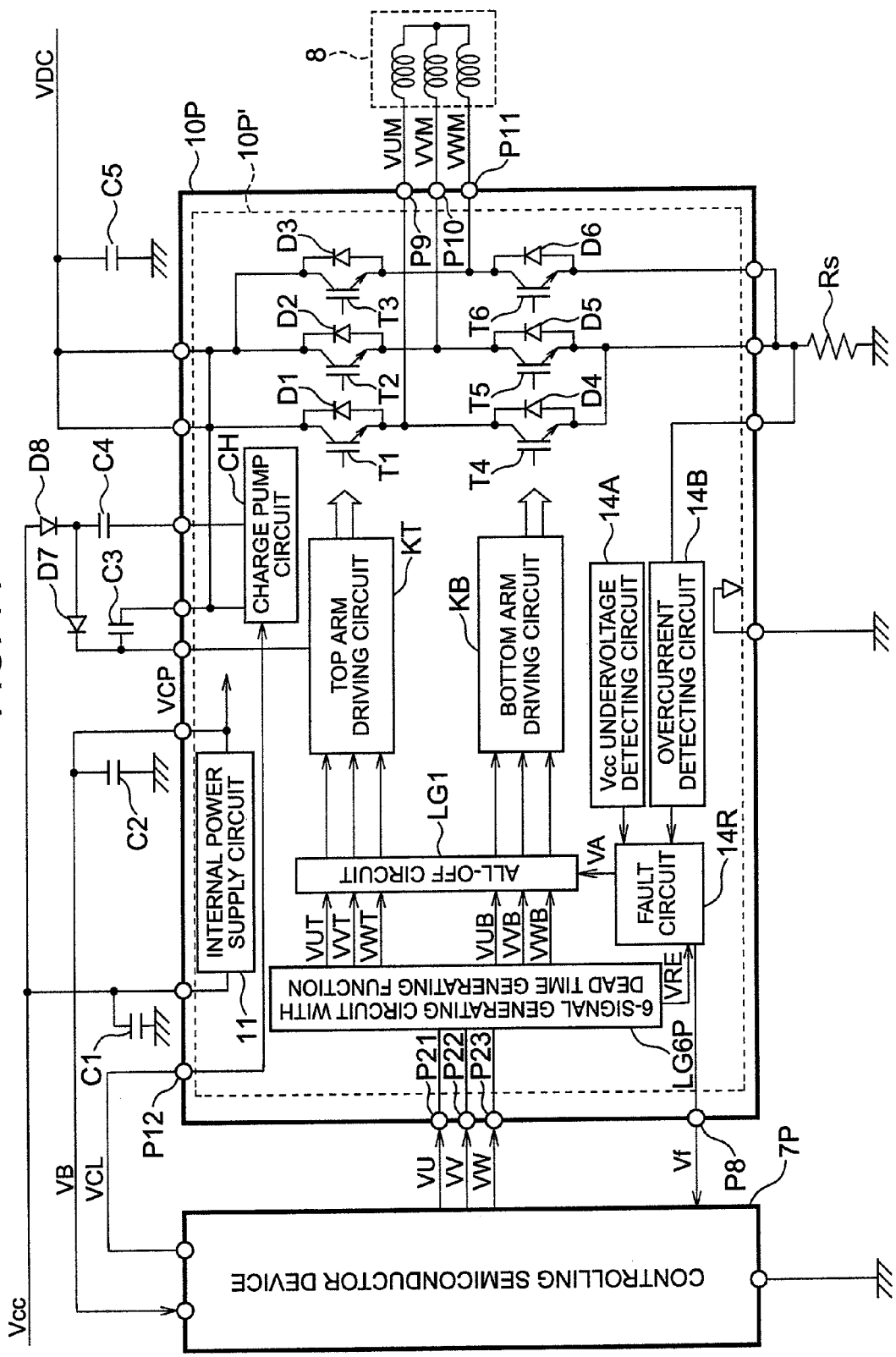
FIG. 14 is a schematic block diagram showing a fourth embodiment in accordance with the present invention.

FIG. 14 is a schematic block diagram showing a fourth embodiment in accordance with the present invention.

In the fourth embodiment, the reset signal VRE (outputted by the controlling semiconductor device 7R in the third embodiment) is outputted by a 6-signal generating circuit LG6P having the dead time generating function.

Figure 15:
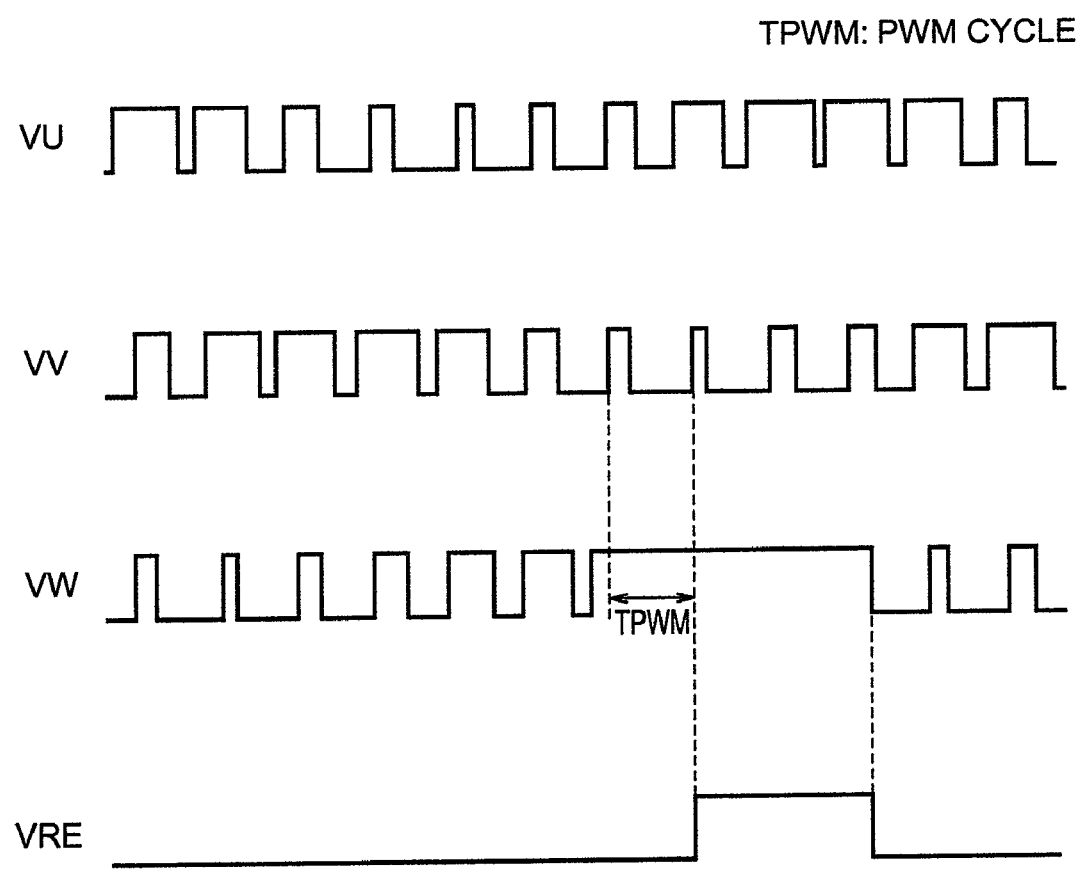
FIG. 15 is a timing chart for explaining a reset signal employed in the fourth embodiment.
Figure 16:
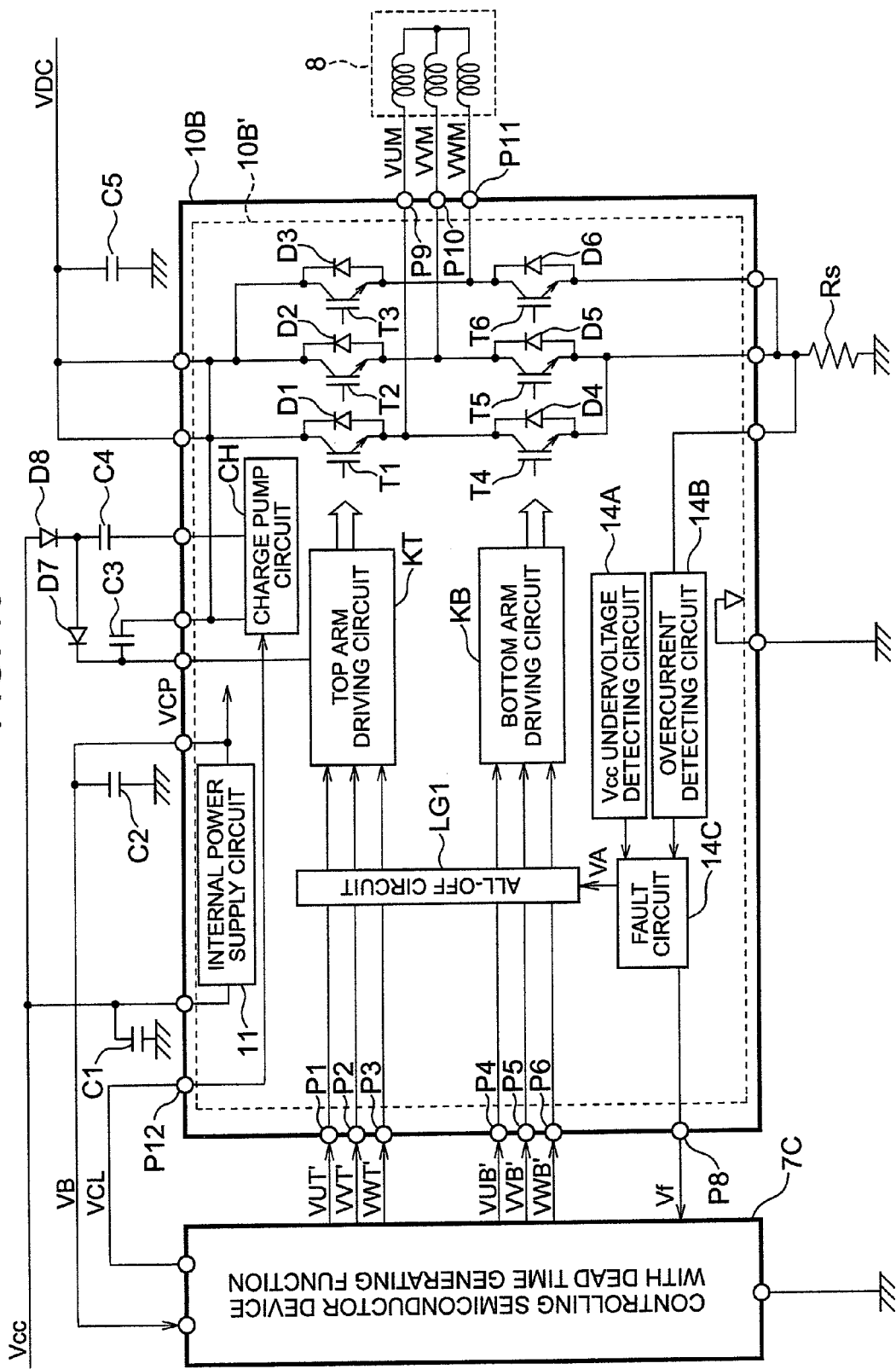
FIG. 16 is a schematic block diagram for explaining a conventional 180-degree sine wave drive technology.
Figure 17:
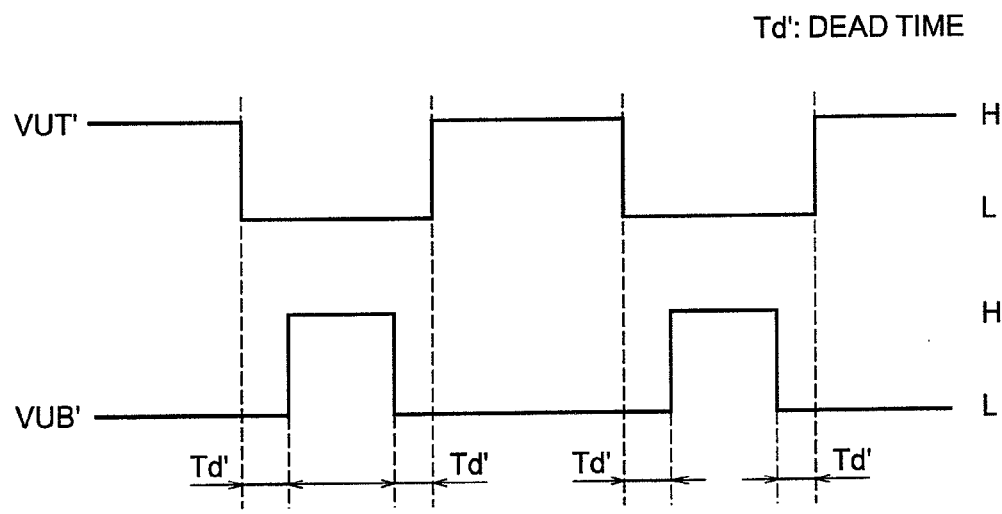
FIG. 17 is a timing chart showing control signals (for one phase) in the conventional 180-degree sine wave drive technology.
Figure 18:
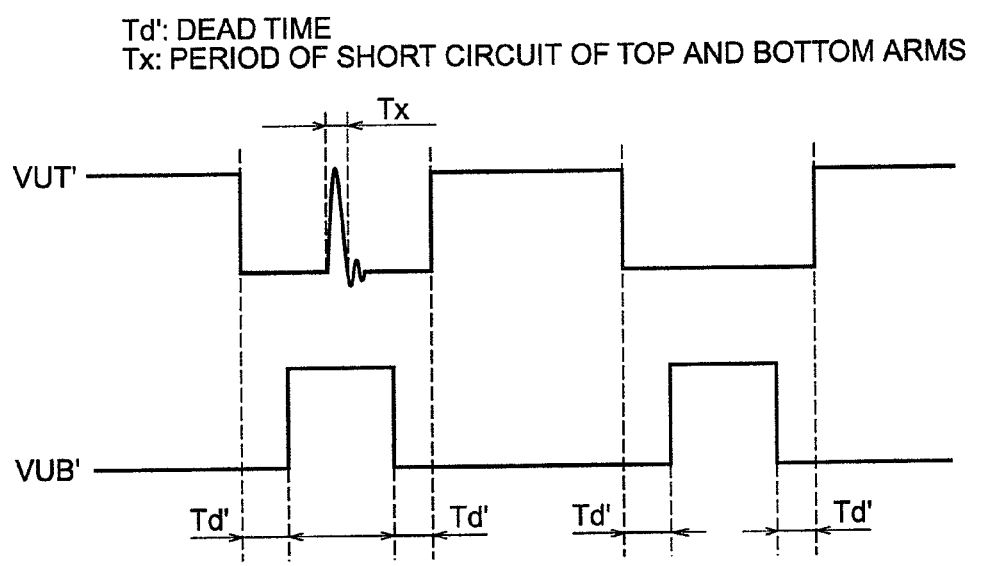
FIG. 18 is a timing chart showing control signals (for one phase) in the conventional 180-degree sine wave drive technology when noise is added to a control signal.

FIG. 15 is a timing chart for explaining the reset signal VRE employed in this embodiment, wherein VU, VV and VW represent a U-phase control signal, a V-phase control signal and a W-phase control signal outputted by a controlling semiconductor device 7P and VRE represents the reset signal outputted by the 6-signal generating circuit LG6P with the dead time generating function.

Similarly to the third embodiment, the timing for outputting the reset signal is determined by the controlling semiconductor device 7P in this embodiment. However, the controlling semiconductor device 7P in this embodiment transmits the reset signal by adding "reset information" to the three control signals VU, VV and VW, without having a signal line for the transmission of the reset signal.

While the waveform of each control signal (VU, VV, VW) can vary depending on the control method, each control signal generally oscillates between H and L at the PWM cycle in the case of sine wave drive of a motor. Therefore, a reset command can be issued by fixing the electric potential of a control signal for the PWM cycle or more. The PWM frequency is generally several kHz—several tens of kHz.

In the example of FIG. 15, the reset command is issued from the controlling semiconductor device 7P to the 6-signal generating circuit LG6P with the dead time generating function by fixing the W-phase control signal VW at "H" for the PWM cycle TPWM or more. The 6-signal generating circuit LG6P with the dead time generating function recognizes the fixation of the W-phase control signal VW (at "H" for the PWM cycle TPWM or more) by taking advantage of the oscillation of the V-phase control signal VV between H and L at the PWM cycle (specifically, by detecting the second rise of the V-phase control signal VV from L to H after a rise of the W-phase control signal VW from L to H), and outputs the reset signal to the fault circuit 14R.

Incidentally, while the controlling semiconductor device 7R issues the reset command by fixing the electric potential of one of the three control signals (VU, VV, VW) in the example of FIG. 15, the reset command can also be issued by fixing electric potentials of two or three of the control signals.

While a control signal that is not fixed is used for the judgment on the fixation of the electric potential for the PWM cycle or more in the example of FIG. 15, the judgment may also be made using other information, such as the clock signal VCL or a circuit (e.g. CR circuit) capable of measuring time.

As above, in the fourth embodiment, the reset command can be issued from the controlling semiconductor device 7P to the three-input motor driving IC 10P without the need of the signal line for the transmission of the reset signal or the reset signal input terminal P24 of the three-input motor driving IC. Similarly to the third embodiment, the inverter can be stopped by an instruction from the controlling semiconductor device 7P when the three-input motor driving IC 10P is not in the protective operating state. Thus, the effects of the third embodiment can be achieved by this embodiment with a more simplified configuration.

The other part of the fourth embodiment is similar to the third embodiment, and thus repeated explanation thereof is omitted here.

Embodiment 5

Figure 9:
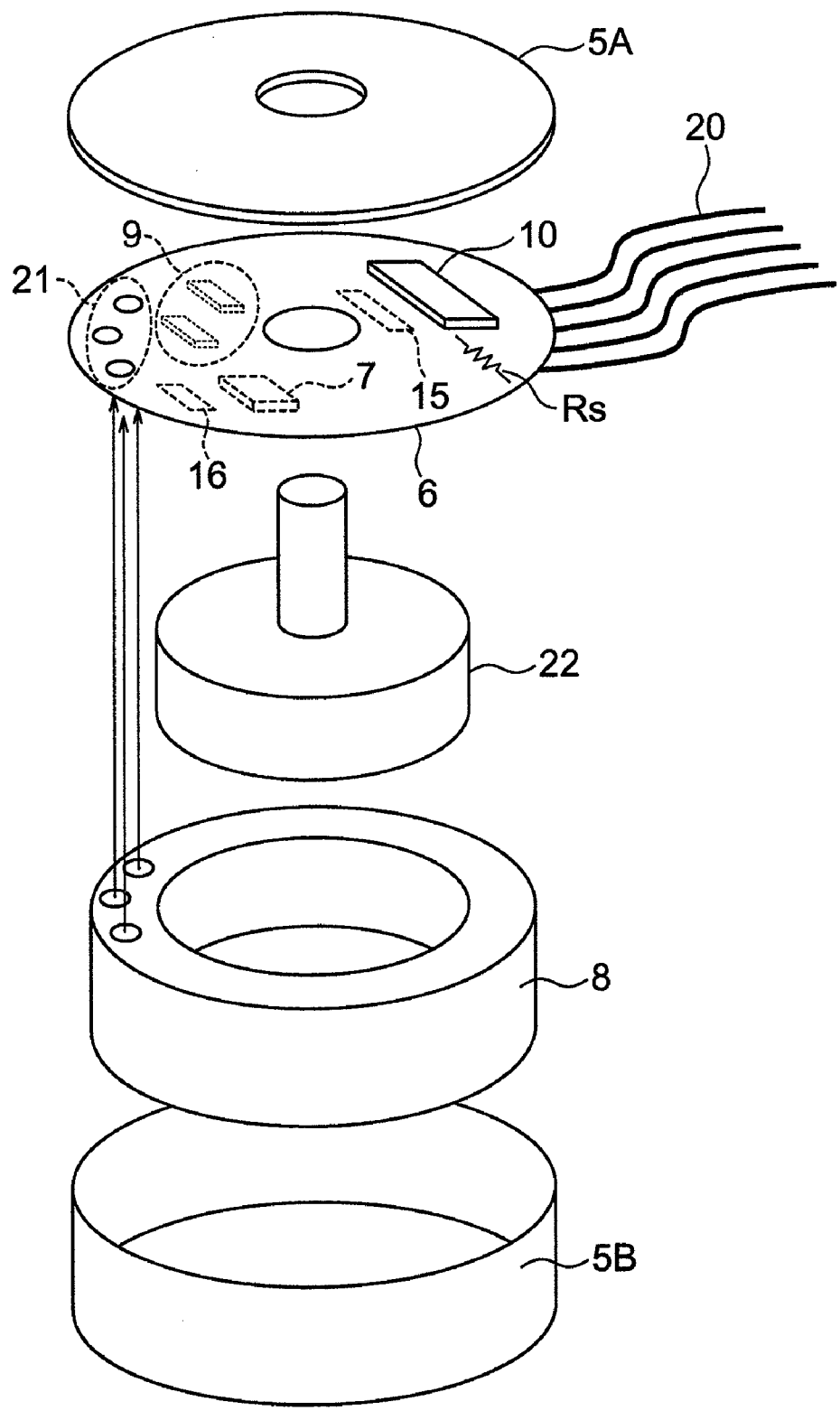
FIG. 9 is a schematic diagram showing a first example of the structure of a motor in accordance with a fifth embodiment of the present invention.

FIG. 9 is a schematic diagram showing an example of the structure of a motor 5 in accordance with a fifth embodiment of the present invention. While any of the above embodiments 1-4 can be applied to the motor of FIG. 9, an example of application of the first embodiment will be described below. The motor shown in FIG. 9 is a three-phase motor including the controlling semiconductor device 7, the three-input motor driving IC 10, a high power supply voltage detecting circuit 15, a temperature detecting circuit 16, the shunt resistor Rs and Hall ICs 9 which are mounted on an in-motor circuit board 6. In the motor 5 of this embodiment, a coil unit 8 is fit in a lower part 5B of a motor housing. A permanent magnet rotor 22 is placed inside the coil unit 8 while securing an appropriate gap to prevent the rotor from contacting the coil unit. The in-motor circuit board 6 is placed above the permanent magnet rotor 22. The Hall ICs 9 are mounted on one surface of the in-motor circuit board 6 facing the permanent magnet rotor 22 (lower surface in FIG. 9) so that the positions of magnetic poles of the permanent magnet rotor 22 can be detected with ease. For example, the controlling semiconductor device 7, the high power supply voltage detecting circuit 15, the temperature detecting circuit 16 and the shunt resistor Rs may be mounted on the surface of the in-motor circuit board 6 facing the permanent magnet rotor 22 (lower surface in FIG. 9) while placing the three-input motor driving IC 10 on the opposite surface (upper surface in FIG. 9).

In cases where the temperature detecting circuit 16 is used for detecting the temperature of the controlling semiconductor device 7, a thermistor of the temperature detecting circuit 16 is placed in the vicinity of the controlling semiconductor device 7. The in-motor circuit board 6 is equipped with coil connection terminals 21, to which the ends of the coils of the coil unit 8 are connected with solder. Lead wires 20 are connected to the in-motor circuit board 6 with solder. The lead wires 20 include five lines: a VDC line, a Vcc line, a Vsp line, an FG line and a GND line. An upper part 5A of the motor housing is placed above the in-motor circuit board 6 as a lid. Thus, in the assembled state of the motor 5, the in-motor circuit board 6 is contained in the motor housing made up of the upper part 5A and the lower part 5B.

Figure 10:
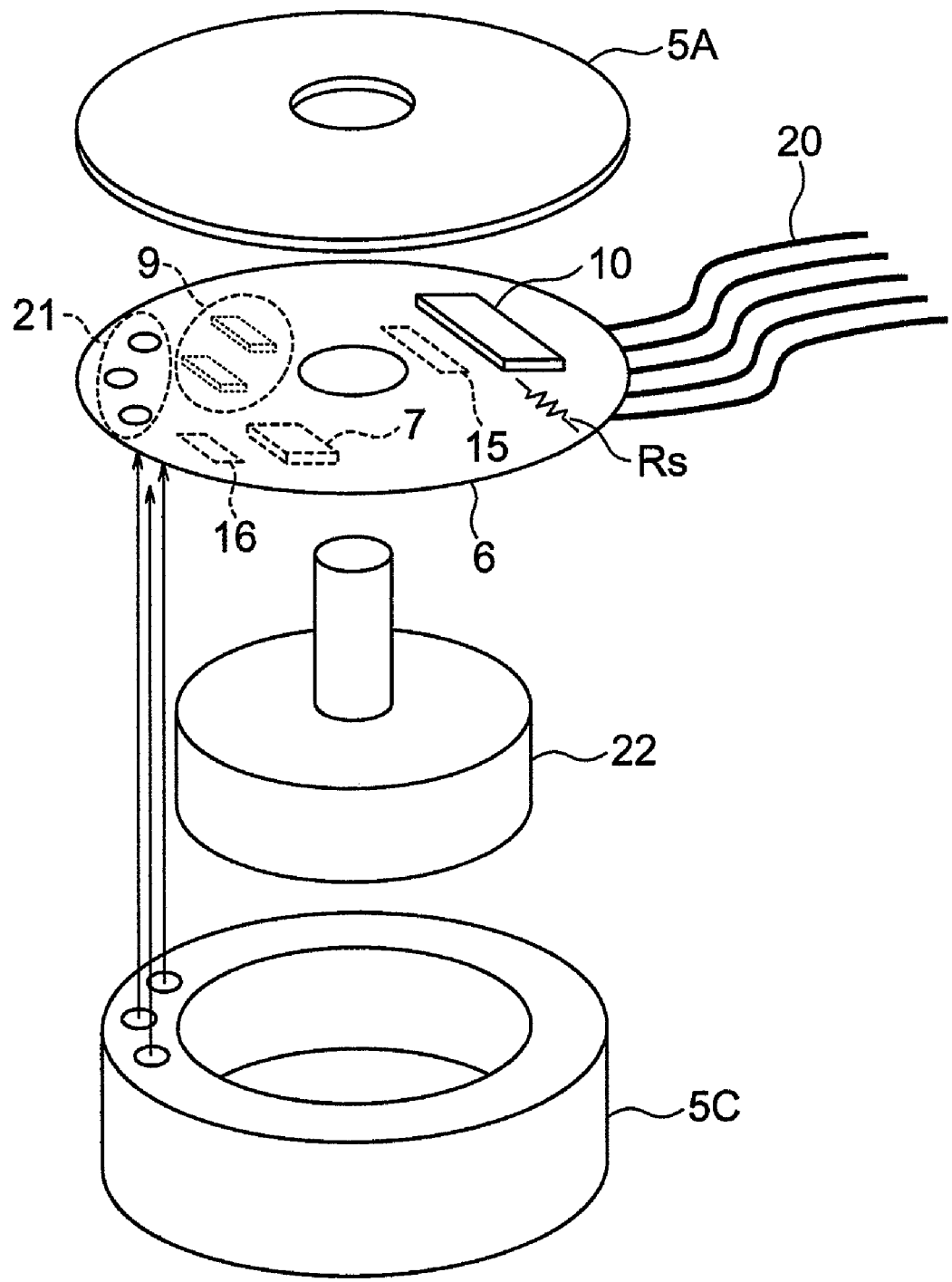
FIG. 10 is a schematic diagram showing a second example of the structure of the motor in accordance with the fifth embodiment.

The motor 5 may also be formed without using the lower part 5B of the motor housing, by using a molded coil unit instead. FIG. 10 is a schematic diagram showing such an example. The reference character "5C" in FIG. 10 denotes the molded coil unit. The other parts of the motor 5 are similar to those in FIG. 9.

Figure 11:
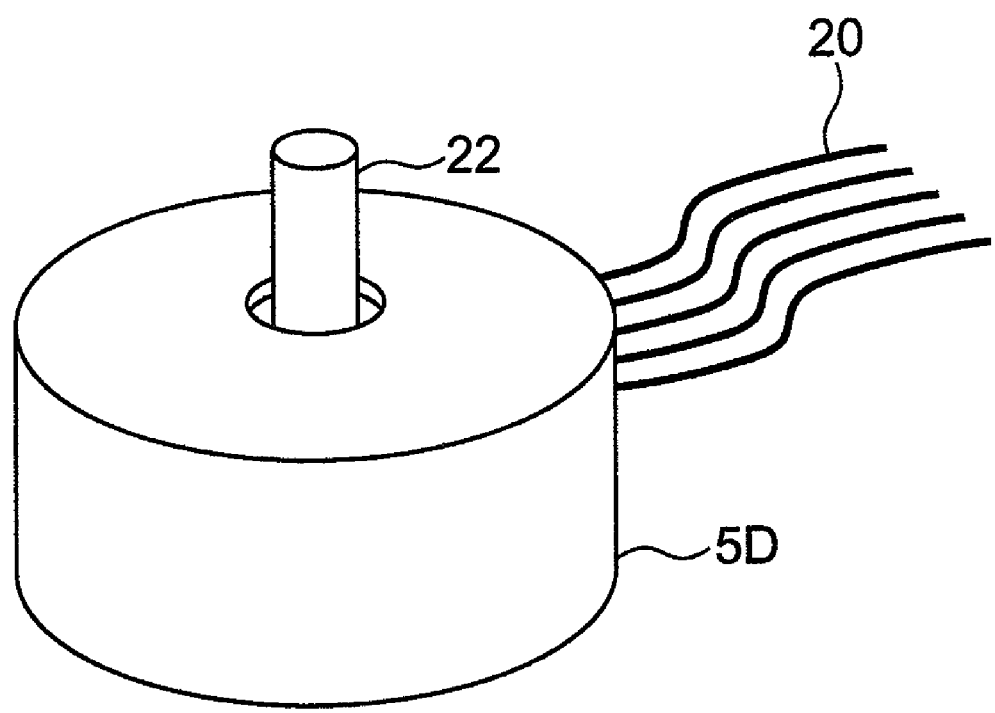
FIG. 11 is a schematic diagram showing a third example of the structure of the motor in accordance with the fifth embodiment.

Further, the motor 5 may also be formed without using the upper and lower parts 5A and 5B of the motor housing, by molding the coil unit 8 and the in-motor circuit board 6 together. FIG. 11 is a schematic diagram showing such an example. FIG. 11 shows the assembled state (completed state) of the motor differently from FIGS. 9 and 10. In a mold part 5D, the coil unit 8 and the in-motor circuit board 6 are molded together. The in-motor circuit board 6 is equipped with the controlling semiconductor device 7, the three-input motor driving IC 10, the high power supply voltage detecting circuit 15, the temperature detecting circuit 16, the shunt resistor Rs and the Hall ICs 9 similarly to the example of FIG. 9.

Since the top-bottom arm short-circuit due to noise to the control signals is prevented by the effects of the above embodiments, high reliability can be secured even if the controlling semiconductor device 7 and the three-input motor driving IC 10 are placed inside the motor (with a larger amount of noise) as shown in FIGS. 9-11.

In cases where each motor shown in FIGS. 9-11 is a fan motor of an air conditioner, for example, the diameter of the motor is as small as approximately 6 cm-12 cm. The three-input motor driving IC in the above embodiments, which is not a large unit like an inverter module but a small IC, can be installed in such a small-sized motor.

Embodiment 6

In the following sixth embodiment, the motor 5 described in the fifth embodiment is employed for a system.

Figure 7:
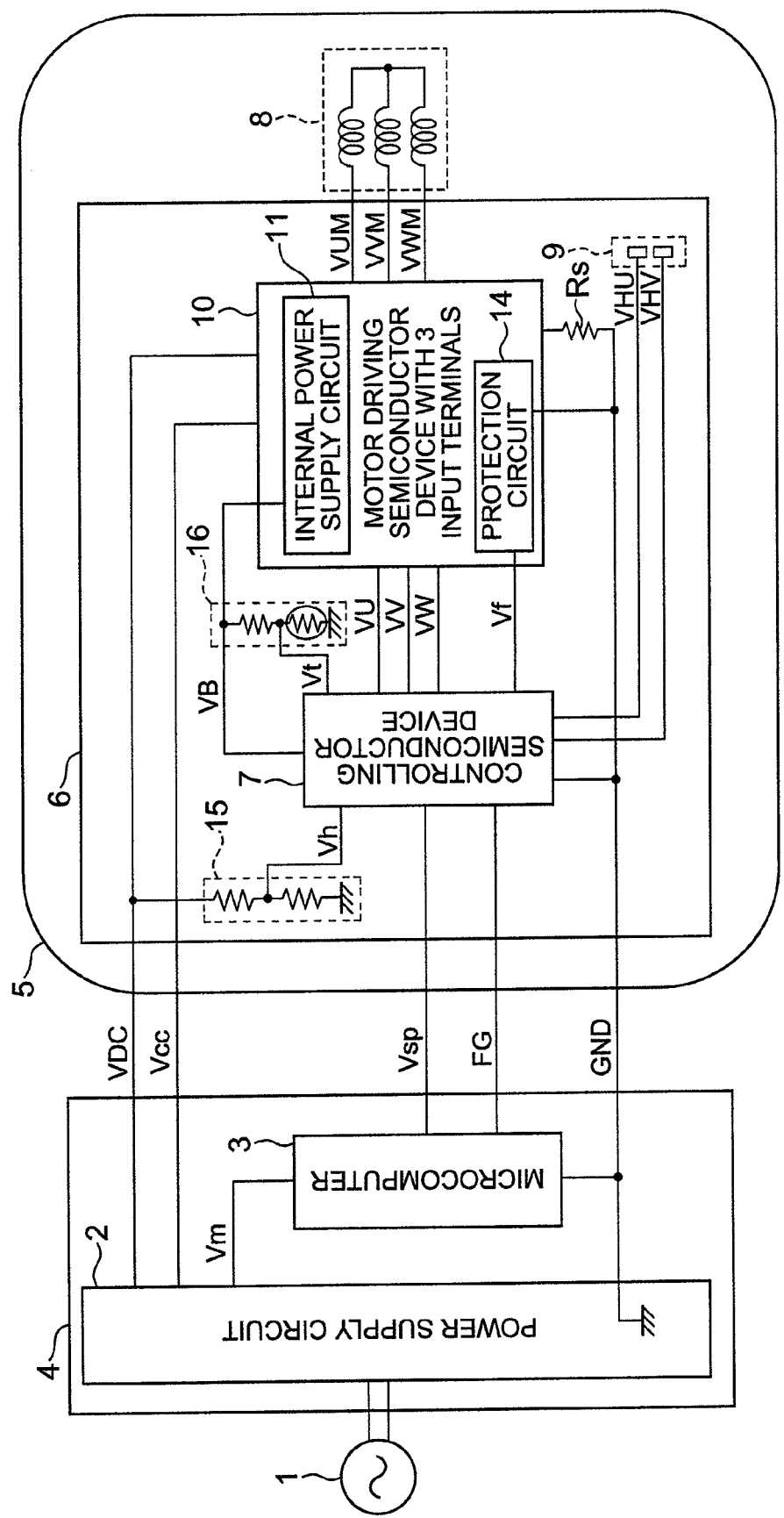
FIG. 7 is a schematic block diagram showing a system (employing a motor in accordance with a fifth embodiment) in accordance with a sixth embodiment of the present invention.

FIG. 7 is a schematic block diagram showing an example of a system employing the motor 5, wherein some peripheral components and internal components of the three-input motor driving IC 10 are not shown for the sake of simplicity.

In FIG. 7, the reference character 1 denotes a commercial power supply, and 2 denotes a power supply circuit which generates DC voltages VDC, Vcc and Vm based on AC voltage supplied from the commercial power supply 1. The voltage VDC is a high voltage (approximately 141 V-450 V, for example) which is used as the high power supply voltage for driving the inverter of the motor 5. The voltage Vcc (approximately 15V, for example) is the driving circuit power supply voltage which is used by the three-input motor driving IC 10. The voltage Vm (approximately 2 V-5.5 V, for example) is a power supply voltage for a microcomputer 3. The power supply circuit 2 and the microcomputer 3 are mounted on a first circuit board 4.

The microcomputer 3 outputs a speed command signal Vsp while receiving a revolving speed signal FG outputted by the motor 5. The microcomputer 3 controls the revolving speed of the motor 5 by outputting the speed command signal Vsp. The speed command signal Vsp may either be implemented by an analog signal or a pulse signal. While the microcomputer 3 and the controlling semiconductor device 7 are directly connected together by the Vsp line and the FG line in FIG. 7, the connection may also be made via a photo coupler or a buffer circuit. For example, the system may be configured to let the microcomputer 3 output the speed command signal Vsp as a pulse signal and let a CR integrating circuit (including a capacitor and a resistor) convert the pulse signal into an analog signal and supply the analog speed command signal Vsp to the controlling semiconductor device 7.

The reference character 6 in FIG. 7 denotes the in-motor circuit board. The in-motor circuit board 6 is installed in the motor 5. The controlling semiconductor device 7, the three-input motor driving IC 10, the Hall ICs 9, the shunt resistor Rs, the high power supply voltage detecting circuit 15 and the temperature detecting circuit 16 are mounted on the in-motor circuit board 6.

Although not shown in FIG. 7, the voltage Vcc or VB is used as the power supply voltage for the Hall ICs 9. Hall elements (less expensive than Hall ICs 9) may also be used instead of the Hall ICs 9. The Hall ICs 9 and Hall elements are examples of magnetic pole position detectors which output magnetic pole position signals indicating the position of the permanent magnet rotor 22 of the motor 5. In the case of Hall elements, the output voltage of each Hall element means the voltage (potential difference) between two terminals of the Hall element. Since the output voltage of a Hall element is generally minute (less than 1 V), the signal (output voltage) has to be amplified by use of an amplifier. While two Hall ICs 9 are used as the magnetic pole position detectors in FIG. 7, the number of magnetic pole position detectors (Hall ICs, Hall elements, etc.) may also be three or one.

To the controlling semiconductor device 7 shown in FIG. 7, the power supply voltage VB, the speed command signal Vsp from the microcomputer 3, the fault signal Vf from the three-input motor driving IC 10, a high power supply voltage signal Vh from the high power supply voltage detecting circuit 15, a temperature signal Vt from the temperature detecting circuit 16, and magnetic pole position signals VHU and VHV from the Hall ICs 9 are inputted.

The power supply voltage VB for the controlling semiconductor device 7 is approximately 2 V-5.5 V, for example. The power supply voltage VB, which is generated inside the three-input motor driving IC 10 in FIG. 7, may also be generated by an external regulator, Zener diode, etc. from the driving circuit power supply voltage Vcc. It is also possible to supply the power supply voltage Vm (for the microcomputer 3 on the first circuit board 4) also to the controlling semiconductor device 7, instead of generating the power supply voltage VB for the controlling semiconductor device 7 inside the motor 5.

The controlling semiconductor device 7 outputs the control signals VU, VV and VW to the three-input motor driving IC 10, while outputting the revolving speed signal FG to the microcomputer 3.

While only the internal power supply circuit 11 and a protection circuit 14 are shown in the three-input motor driving IC 10 in FIG. 7, the three-input motor driving IC 10 is actually configured similarly to the previous embodiments.

The output terminals of the three-input motor driving IC 10 are connected to the coil unit 8 of the motor 5. The shunt resistor Rs is placed between the ground potential GND and the bottom-arm switching elements of the three-input motor driving IC 10. The shunt resistor Rs is used for monitoring the amount of electric current passing through the switching elements, for example.

The high power supply voltage detecting circuit 15, which is supplied with the high power supply voltage VDC, outputs the high power supply voltage signal Vh as information on the high power supply voltage VDC. In the example of FIG. 7, the high power supply voltage detecting circuit 15 converts the high power supply voltage VDC into a low voltage by use of two resistors connected in series and outputs the converted voltage as the high power supply voltage signal Vh.

The temperature detecting circuit 16 outputs the temperature signal Vt (containing information on the temperature) to the controlling semiconductor device 7. In FIG. 7, the temperature detecting circuit 16 is made up of a resistor and a thermistor as a temperature detecting element. The controlling semiconductor device 7 stops the motor 5 or reduces the electric current passing through the coil unit 8 of the motor 5, for example, in case of abnormally high temperature based on the temperature signal Vt. By this function, malfunction and breakage due to abnormally high temperature of the three-input motor driving IC 10, the controlling semiconductor device 7, etc. can be prevented.

In order to protect the controlling semiconductor device 7 from overheating by use of the temperature detecting circuit 16, the thermistor is desired to be placed in the vicinity of the controlling semiconductor device 7. While there exist various thermistors such as those with resistance having positive temperature dependence, those with resistance having negative temperature dependence, those with resistance sharply changing at a specific temperature, etc., any thermistor can be used for the temperature detecting circuit 16. The temperature detecting element of the temperature detecting circuit 16 is not restricted to a thermistor; other sensors (diode, Si semiconductor temperature sensor, etc.) can also be used.

While the controlling semiconductor device 7, the three-input motor driving IC 10, the high power supply voltage detecting circuit 15, the temperature detecting circuit 16 and the shunt resistor Rs are mounted on the in-motor circuit board 6 in the example of FIG. 7, the components (7, 10, 15, 16, Rs) may also be mounted on the first circuit board 4.

An air conditioner is made up of an outdoor unit and an indoor unit. The outdoor unit includes a compressor for compressing a refrigerant, an outdoor heat exchanger, and an outdoor unit fan motor for sending air to the outdoor heat exchanger. Meanwhile, the indoor unit includes an indoor heat exchanger and an indoor unit fan motor for sending air to the indoor heat exchanger. Such an air conditioner is generally capable of switching its function between cooling and heating, by switching the flow direction of the refrigerant by use of a valve.

When the example of FIG. 7 is applied to an indoor unit of an air conditioner, the motor 5 shown in FIG. 7 is usable as the fan motor of the indoor unit. When the example of FIG. 7 is applied to an outdoor unit of an air conditioner, the motor 5 shown in FIG. 7 is usable as the fan motor of the outdoor unit, for example.

It should be further understood by those skilled in the art that although the foregoing description has been on embodiments of the invention, the invention is not limited thereto and various changes and modifications may be made without departing from the spirit of the invention and the scope of the appended claims.

The invention claimed is:

1. The semiconductor device for driving a motor being sealed with resin as one package and comprising six switching elements for driving a three-phase motor, three output terminals for outputting voltages to the three-phase motor, and at least one driving circuit for driving the six switching elements, wherein the semiconductor device comprises:
   three control signal input terminals; and
   a function of generating six control signals for control of the six switching elements based on three control signals inputted through the three control signal input terminals,
   wherein the semiconductor device has a dead time generating function,
   wherein the length of the dead time generated by the dead time generating function has positive temperature dependence.

2. The semiconductor device for driving a motor according to claim 1, wherein the semiconductor device is formed by sealing one semiconductor chip with resin as one package.

3. The semiconductor device for driving a motor according to claim 1, wherein:
   the driving circuit, the function of generating the six control signals, and the dead time generating function are configured on at least one first semiconductor chip, and
   the six switching elements are configured on at least one second semiconductor chip, and
   the first semiconductor chip and the second semiconductor chip are sealed with resin as one package.

4. The semiconductor device for driving a motor according to claim 1, wherein the dead time generating function is implemented by a circuit employing delay caused by a resistor or by on-state resistance of a MOS (Metal-Oxide Semiconductor).

5. The semiconductor device for driving a motor according to claim 1, wherein the dead time generating function is implemented by:
   a delay circuit for increasing a rising time and a falling time of each of the three control signals; and
   two circuits to which an output signal of the delay circuit is inputted;
   wherein the two circuits has different threshold voltages.

6. A motor driving apparatus comprising:
   the semiconductor device for driving a motor according to claim 1; and
   a controlling semiconductor device for outputting the three control signals to the semiconductor device for driving a motor.

7. The motor driving apparatus according to claim 6, wherein the semiconductor device for driving a motor supplies power to the controlling semiconductor device.

8. The motor driving apparatus according to claim 6, wherein the controlling semiconductor device outputs a reset signal for canceling a protective function operating state of the semiconductor device for driving a motor to the semiconductor device.

9. The motor driving apparatus according to claim 6, wherein a protective function operating state of the semiconductor device for driving a motor is canceled by fixing at least one of the three control signals at "H" or "L".

10. A three-phase motor comprising the motor driving apparatus according to claim 6 installed therein.

11. The semiconductor device for driving a motor according to claim 3, further comprising a reset signal input terminal for receiving a reset signal for canceling a protective function operating state of the semiconductor device.

12. The motor driving apparatus according to claim 9, wherein a time from the fixation of the at least one of the three control signals at "H" or "L" to the cancellation of the protective function operating state of the semiconductor device for driving a motor is a PWM cycle or more.

13. A fan motor for sending air to an indoor heat exchanger or an outdoor heat exchanger of an air conditioner having a compressor for compressing a refrigerant, the indoor heat exchanger for indoor heat exchange of the refrigerant, and the outdoor heat exchanger for outdoor heat exchange of the refrigerant, wherein:
   the fan motor is implemented by the three-phase motor according to claim 10.

14. The semiconductor device for driving a motor being sealed with resin as one package and comprising six switching elements for driving a three-phase motor, three output terminals for outputting voltages to the three-phase motor, and at least one driving circuit for driving the six switching elements, wherein the semiconductor device comprises:
   three control signal input terminals; and
   a function of generating six control signals for control of the six switching elements based on three control signals inputted through the three control signal input terminals,
   wherein the semiconductor device has a dead time generating function,
   wherein the dead time generating function generates the dead time by setting an ON delay time of each of the six control signals longer than its OFF delay time.

15. A motor driving apparatus comprising six switching elements for driving a three-phase motor, at least one driving circuit for driving the six switching elements, a function of generating six control signals for controlling the six switching elements based on three control signals, and a dead time generating function, wherein:
   a protective function operating state of the motor driving apparatus is canceled by fixing at least one of the three control signals at "H" or "L".

16. The motor driving apparatus according to claim 15, wherein a time from the fixation of the at least one of the three control signals at "H" or "L" to the cancellation of the protective function operating state is a PWM cycle or more.

17. A semiconductor device for driving a motor, being sealed with resin as one package and comprising six switching elements for driving a three-phase motor, three output terminals for outputting voltages to the three-phase motor, and at least one driving circuit for driving the six switching elements, wherein the semiconductor device comprises:
   three control signal input terminals;
   a function of generating six control signals for control of the six switching elements based on three control signals inputted through the three control signal input terminals;
   a dead time generating function; and
   a reset signal input terminal for receiving a reset signal for canceling a protective function operating state of the semiconductor device.

* * * * *